United States Patent
Park et al.

(10) Patent No.: US 12,557,417 B2
(45) Date of Patent: Feb. 17, 2026

(54) IMAGE SENSOR INCLUDING A GROUND REGION SHARED BY PIXELS

(71) Applicant: Samsung Electronics Co., Ltd., Suwon-si (KR)

(72) Inventors: Haeyong Park, Yongin-si (KR); Sungsoo Choi, Seongnam-si (KR); Jongeun Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 664 days.

(21) Appl. No.: 17/834,318

(22) Filed: Jun. 7, 2022

(65) Prior Publication Data
US 2023/0092590 A1    Mar. 23, 2023

(30) Foreign Application Priority Data
Sep. 17, 2021    (KR) .................. 10-2021-0125031

(51) Int. Cl.
    *H10F 39/00*    (2025.01)
    *H10F 39/18*    (2025.01)

(52) U.S. Cl.
    CPC ....... *H10F 39/807* (2025.01); *H10F 39/8053* (2025.01); *H10F 39/8063* (2025.01); *H10F 39/18* (2025.01)

(58) Field of Classification Search
    CPC ........... H01L 27/1463; H01L 27/14643; H01L 27/14641
    USPC ...................................................... 257/432
    See application file for complete search history.

(56) References Cited

U.S. PATENT DOCUMENTS

| | | |
|---|---|---|
| 8,390,089 B2 | 3/2013 | Chen et al. |
| 9,466,629 B2 | 10/2016 | Yoon et al. |
| 10,109,664 B2 | 10/2018 | Baek et al. |
| 10,498,947 B2 | 12/2019 | Cheng et al. |
| 10,644,051 B2 | 5/2020 | Nah et al. |
| 10,868,070 B2 | 12/2020 | Jin et al. |

(Continued)

FOREIGN PATENT DOCUMENTS

| | | |
|---|---|---|
| KR | 20190049459 A | 5/2019 |
| KR | 20200051867 A | 5/2020 |

(Continued)

*Primary Examiner* — Eric W Jones
*Assistant Examiner* — Laura M Dykes
(74) *Attorney, Agent, or Firm* — Harness, Dickey & Pierce, P.L.C.

(57) ABSTRACT

An image sensor includes a substrate having first and second surfaces opposite each other, including first and second pixels adjacent to each other, a device isolation portion isolating the first and second pixels from each other in the substrate, a transfer gate on the first surface of the first and second pixels, a ground region in one of the first and second pixels, and a first color filter and a micro lens array layer stacked on the second surface. The deep device isolation portion includes first and second isolation portions vertically overlapping and spaced apart. The first isolation portion includes a first conductive pattern extending from the first surface toward the second surface, a high-concentration doped pattern on the first conductive pattern, and an insulating pattern between the first conductive pattern and the high-concentration doped pattern. The ground region and high-concentration doped pattern include dopants having the same conductivity type.

18 Claims, 34 Drawing Sheets

(56) References Cited

U.S. PATENT DOCUMENTS

| | | | | |
|---|---|---|---|---|
| 2015/0271425 A1* | 9/2015 | Fukuda | ................ | H04N 25/134 |
| | | | | 348/320 |
| 2017/0345853 A1* | 11/2017 | Kato | ...................... | H04N 23/67 |
| 2019/0132506 A1* | 5/2019 | Cheng | ................. | H01L 27/1463 |
| 2019/0165026 A1 | 5/2019 | Kuo et al. | | |
| 2021/0028204 A1* | 1/2021 | Fujita | ................ | H01L 27/14812 |
| 2021/0143191 A1* | 5/2021 | Ha | .................... | H01L 27/14641 |
| 2021/0183920 A1* | 6/2021 | Lee | .................. | H01L 27/14605 |
| 2022/0102397 A1* | 3/2022 | Wu | .................... | H01L 27/14612 |
| 2022/0415936 A1* | 12/2022 | Jeon | ................. | H01L 27/14627 |
| 2023/0029874 A1* | 2/2023 | Chen | ................ | H01L 27/14603 |
| 2023/0215887 A1* | 7/2023 | Qian | ................ | H01L 27/14649 |
| | | | | 257/432 |

FOREIGN PATENT DOCUMENTS

| | | |
|---|---|---|
| KR | 20210012437 A | 2/2021 |
| KR | 20210056478 A | 5/2021 |
| KR | 20210076286 A | 6/2021 |

* cited by examiner

IMAGE SENSOR INCLUDING A GROUND REGION SHARED BY PIXELS

CROSS-REFERENCE TO RELATED APPLICATIONS

This U.S. non-provisional patent application claims priority under 35 U.S.C. § 119 to Korean Patent Application No. 10-2021-0125031, filed on Sep. 17, 2021, in the Korean Intellectual Property Office, the entire contents of which are hereby incorporated by reference.

BACKGROUND OF THE INVENTION

The present disclosure relates to image sensors having a selective ground region.

Image sensors are semiconductor devices for converting optical images into electrical signals. As computer and communication industries have been developed, high-performance image sensors have been increasingly demanded in various fields such as a digital camera, a camcorder, a personal communication system (PCS), a game console, a security camera, and a medical micro camera. Image sensors may be categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal. The plurality of pixels may be defined by a deep device isolation pattern disposed therebetween.

SUMMARY

Example embodiments of the inventive concepts may provide image sensors capable of increasing a size of a gate electrode and of minimizing cross-talk between pixels and methods of manufacturing the same.

Example embodiments of the inventive concepts may also provide image sensors capable of easily increasing an integration density and a method of manufacturing the same.

In one aspect of some example embodiments, an image sensor may include a substrate having a first surface and a second surface opposite to the first surface, the substrate including a first pixel and a second pixel adjacent to the first pixel, a deep device isolation portion in the substrate and isolating the first pixel and the second pixel from each other, a transfer gate on the first surface in each of the first pixel and the second pixel, a ground region selectively in one of the first pixel and the second pixel, and a first color filter and a micro lens array layer sequentially stacked on the second surface. The deep device isolation portion may include a first isolation portion and a second isolation portion which vertically overlap with each other and are spaced apart from each other. The first isolation portion may include a first conductive pattern extending from the first surface toward the second surface, a high-concentration doped pattern in the substrate on the first conductive pattern, and an insulating pattern between the first conductive pattern and the high-concentration doped pattern. The ground region and the high-concentration doped pattern may be doped with dopants having the same conductivity type.

In one aspect of some example embodiments, an image sensor may include a substrate having a first surface and a second surface opposite to the first surface, the substrate including a first pixel group, a second pixel group and a pair of third pixel groups which are two-dimensionally arranged in a first direction and a second direction, the first direction parallel to the first surface, the second direction being parallel to the first surface and intersecting the first direction, a first color filter on the first pixel group, a second color filter on the second pixel group, and a third color filter on each of the pair of third pixel groups. Each of the first, second, and third pixel groups may include $N^2$ pixels arranged in a N×N matrix form along the first direction and the second direction, where 'N' is a natural number of 2 or more. A deep device isolation portion may be in the substrate between the $N^2$ pixels and between the first to third pixel groups. The deep device isolation portion may include a first isolation portion extending from the first surface toward the second surface, and a second isolation portion extending from the second surface toward the first surface. The first isolation portion may include a first isolation pattern between the $N^2$ pixels, and a second isolation pattern between the first to third pixel groups. The second isolation portion may include a third isolation pattern between the $N^2$ pixels, and a fourth isolation pattern between the first to third pixel groups. The first isolation pattern and the third isolation pattern may be vertically aligned with each other and may be spaced apart from each other. The second isolation pattern and the fourth isolation pattern may be vertically aligned with each other. One of the $N^2$ pixels may selectively include a ground region. The first isolation portion may include a first conductive pattern extending from the first surface toward the second surface, a high-concentration doped pattern on the first conductive pattern, and an insulating pattern between the first conductive pattern and the high-concentration doped pattern.

In one aspect of some example embodiments, an image sensor may include a substrate having a first surface and a second surface opposite to the first surface, the substrate including a first pixel and a second pixel adjacent to the first pixel, a deep device isolation portion in the substrate and isolating the first pixel and the second pixel from each other, a transfer gate on the first surface in each of the first pixel and the second pixel, a ground region selectively in one of the first pixel and the second pixel, and a color filter and a micro lens array layer sequentially stacked on the second surface. The deep device isolation portion may include a first isolation portion and a second isolation portion which vertically overlap with each other and are spaced apart from each other. The first isolation portion may include a first conductive pattern extending from the first surface toward the second surface, a high-concentration doped pattern on the first conductive pattern, and an insulating pattern between the first conductive pattern and the high-concentration doped pattern. The high-concentration doped pattern may be continuous between the first pixel and the second pixel.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 10A to 19A are cross-sectional views illustrating a method of manufacturing the image sensor of FIG. 5A.

FIGS. 10B to 19B are cross-sectional views illustrating a method of manufacturing the image sensor of FIG. 5B.

DETAILED DESCRIPTION

Example embodiments of the inventive concepts will now be described more fully with reference to the accompanying drawings.

Figure 1:
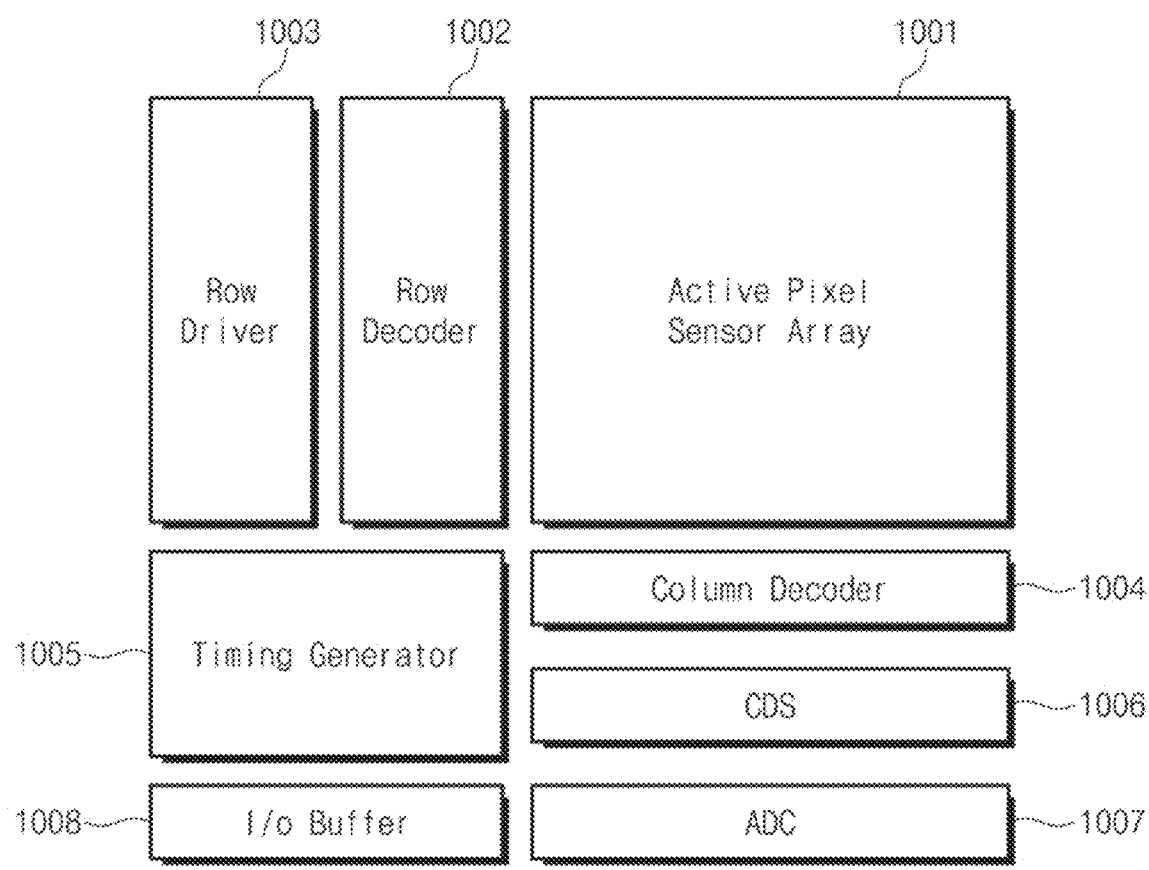
FIG. 1 is a block diagram illustrating an image sensor according to some example embodiments of the inventive concepts.

FIG. 1 is a block diagram illustrating an image sensor according to some example embodiments of the inventive concepts.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of unit pixels two-dimensionally arranged and may convert optical signals into electrical signals. The active pixel sensor array 1001 may be driven by a plurality of driving signals (e.g., a pixel selection signal, a reset signal, and a charge transfer signal) provided from the row driver 1003. In addition, the converted electrical signals may be provided to the correlated double sampler 1006.

The row driver 1003 may provide a plurality of driving signals for driving a plurality of the unit pixels to the active pixel sensor array 1001 in response to signals decoded in the row decoder 1002. When the unit pixels are arranged in a matrix form, the driving signals may be provided in the unit of row of the matrix form.

The timing generator 1005 may provide timing signals and control signals to the row decoder 1002 and the column decoder 1004.

The correlated double sampler 1006 may receive electrical signals generated from the active pixel sensor array 1001 and may hold and sample the received electrical signals. The correlated double sampler 1006 may doubly sample a specific noise level and a signal level of the electrical signal to output a difference level corresponding to a difference between the noise level and the signal level.

The analog-to-digital converter 1007 may convert an analog signal, which corresponds to the difference level outputted from the correlated double sampler 1006, into a digital signal and may output the digital signal.

The I/O buffer 1008 may latch the digital signals and may sequentially output the latched digital signals to an image signal processing unit (not shown) in response to signals decoded in the column decoder 1004.

Figure 2:
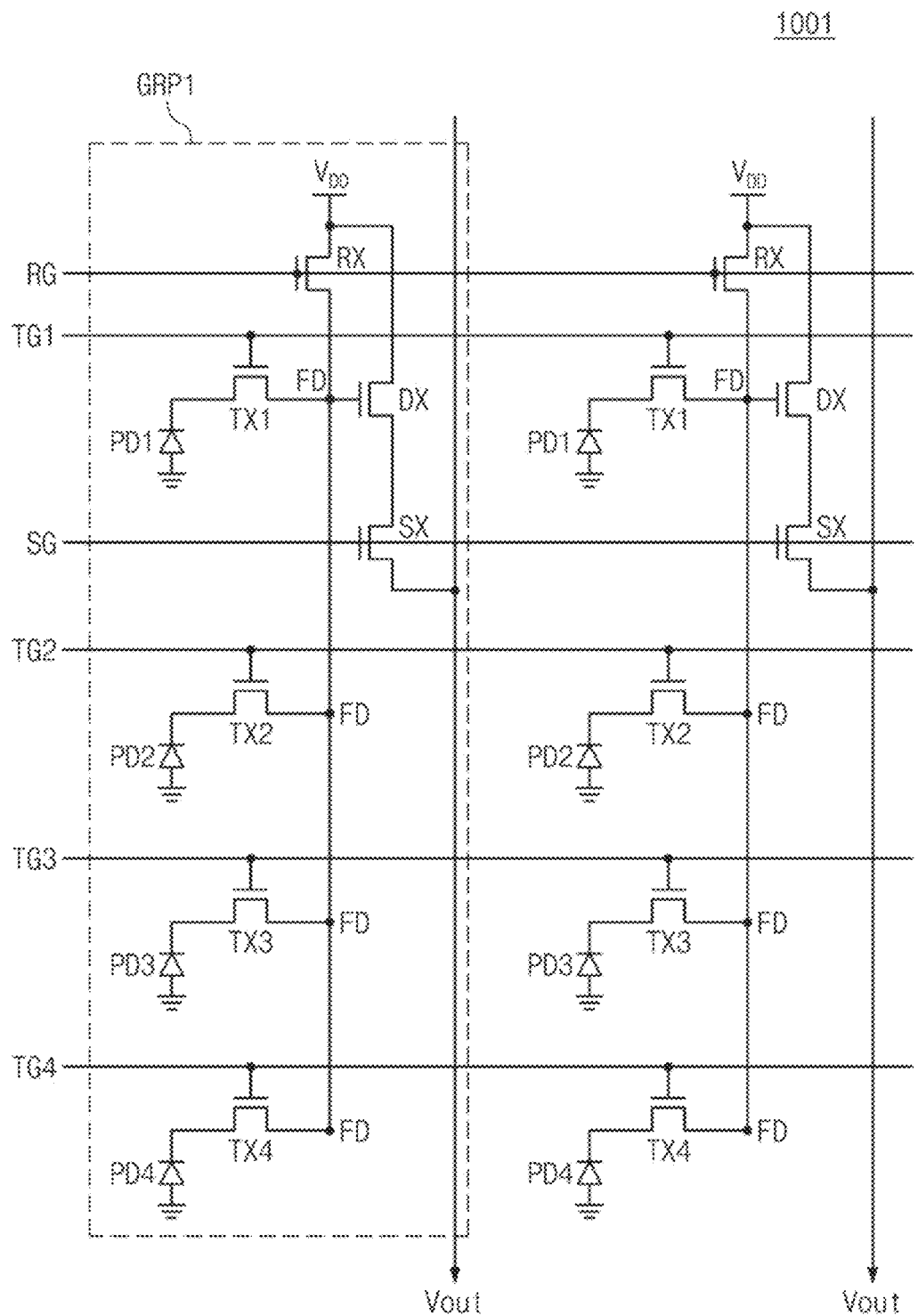
FIG. 2 is a circuit diagram illustrating an active pixel sensor array of an image sensor according to some example embodiments of the inventive concepts.

FIG. 2 is a circuit diagram illustrating an active pixel sensor array of an image sensor according to some example embodiments of the inventive concepts. In particular, FIG. 2 is a circuit diagram of the active pixel sensor array 1001 of FIG. 1. Referring to FIG. 2, each of a plurality of pixel groups (e.g., a first pixel group GRP1) may include first to fourth photoelectric conversion portions PD1, PD2, PD3 and PD4, first to fourth transfer transistors TX1, TX2, TX3 and TX4, and logic transistors RX, SX and DX. Here, the logic transistors may include a reset transistor RX, a selection transistor SX, and a drive transistor DX. Gate electrodes of the first to fourth transfer transistors TX1, TX2, TX3 and TX4, the reset transistor RX and the selection transistor SX may be connected to driving signal lines TG1, TG2, TG3, TG4, RG and SG, respectively.

The first to fourth transfer transistors TX1, TX2, TX3 and TX4 may include first to fourth transfer gate electrodes TG1, TG2, TG3 and TG4 and the first to fourth photoelectric conversion portions PD1, PD2, PD3 and PD4, respectively. In some example embodiments, the first to fourth transfer transistors TX1, TX2, TX3 and TX4 may be connected to floating diffusion regions FD, respectively.

A plurality of the floating diffusion regions FD connected to the transfer transistors TX1, TX2, TX3 and TX4, respectively, may be provided in the pixel group (e.g., GRP1). In some example embodiments, a single floating diffusion region FD may be formed in each of the pixel groups (e.g., GRP1). The transfer transistors TX1, TX2, TX3 and TX4 in each of the pixel groups (e.g., GRP1) may share the single floating diffusion region FD.

The first to fourth (first, second, third, and fourth) photoelectric conversion portions PD1, PD2, PD3 and PD4 may generate and accumulate photocharges (or charges) in proportion to the amount of light incident from the outside. Each of the first to fourth photoelectric conversion portions PD1, PD2, PD3 and PD4 may include a photodiode, a photo transistor, a photo gate, a pinned photodiode (PPD), or any combination thereof.

The floating diffusion regions FD may receive photocharges generated in the first to fourth photoelectric conversion portions PD1, PD2, PD3 and PD4 and may cumulatively store the received photocharges. The drive transistor DX may be controlled according to the amount of the photocharges accumulated in the floating diffusion regions FD.

The reset transistor RX may periodically reset charges accumulated in the floating diffusion regions FD. In detail, a drain electrode of the reset transistor RX may be connected to the floating diffusion region FD, and a source electrode of the reset transistor RX may be connected to a power voltage VDD. When the reset transistor RX is turned-on, the power voltage VDD connected to the source electrode of the reset transistor RX may be transmitted to the floating diffusion region FD. Thus, the charges accumulated in the floating diffusion region FD may be discharged to reset the floating diffusion region FD, when the reset transistor RX is turned-on.

The drive transistor DX may amplify a potential change in the floating diffusion region FD and may output the amplified or pixel signal to an output line Vout through the selection transistor SX. The drive transistor DX may be a source follower buffer amplifier of generating a source-drain current in proportion to the amount of photocharges inputted to its gate electrode. A gate electrode of the drive transistor DX may be connected to the floating diffusion region FD, a drain electrode of the drive transistor DX may be connected to the power voltage VDD, and a source electrode of the drive transistor DX may be connected to a drain electrode of the selection transistor SX.

The selection transistor SX may select pixels to be read in the unit of row. When the selection transistor SX is turned-on, the power voltage VDD connected to the drain electrode of the drive transistor DX may be transmitted to a source electrode of the selection transistor SX.

Figure 3:
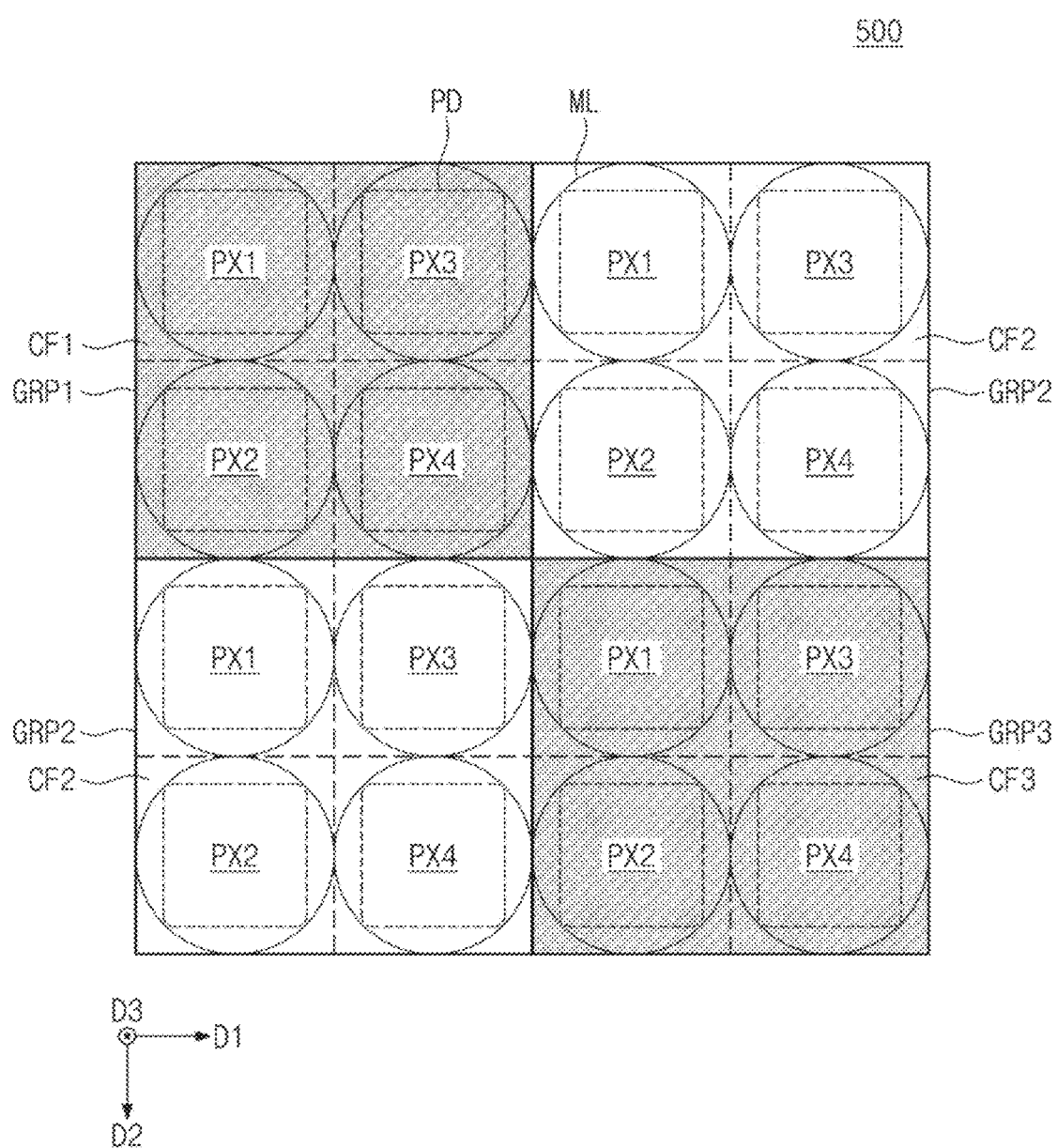
FIG. 3 is a plan view illustrating an image sensor according to some example embodiments of the inventive concepts.

FIG. 3 is a plan view illustrating an image sensor according to some example embodiments of the inventive concepts.

Referring to FIG. 3, an image sensor 500 according to some example embodiments may include first to third pixel groups GRP1, GRP2 and GRP3 two-dimensionally arranged in a first direction D1 and a second direction D2. A first color filter CF1 may be disposed on the first pixel group GRP1. A second color filter CF2 may be disposed on the second pixel group GRP2. A third color filter CF3 may be disposed on the third pixel group GRP3. The first to third color filters CF1 to CF3 may have different colors. For example, the second color filter CF2 may be a green color filter. One of the first color filter CF1 and the third color filter CF3 may be a red color filter, and the other thereof may be a blue color filter. The first to third pixel groups GRP1, GRP2 and GRP3 of FIG. 3 may constitute a group unit, the group unit may be provided in plurality, and the plurality of group units may be two-dimensionally arranged in the first direction D1 and the second direction D2.

Each of the first to third pixel groups GRP1, GRP2 and GRP3 may include $N^2$ pixels arranged in an N×N matrix form consisting of N rows arranged in the second direction D2 and N columns arranged in the first direction D1. Here, 'N' may be a natural number of 2 or more.

For example, like FIG. 3, each of the first to third pixel groups GRP1, GRP2 and GRP3 may include first to fourth pixels PX1 to PX4 arranged in a 2×2 matrix form consisting of 2 rows arranged in the second direction D2 and 2 columns arranged in the first direction D1. In each of the first to third pixel groups GRP1, GRP2 and GRP3, the first and second pixels PX1 and PX2 may be sequentially arranged in the second direction D2 and may constitute a first column. The third and fourth pixels PX3 and PX4 may be sequentially arranged in the second direction D2 and may constitute a second column. The first and third pixels PX1 and PX3 may be sequentially arranged in the first direction D1 and may constitute a first row. The second and fourth pixels PX2 and PX4 may be sequentially arranged in the first direction D1 and may constitute a second row. Photoelectric conversion portions PD may be disposed in the first to fourth pixels PX1 to PX4, respectively. The photoelectric conversion portions PD of the first to fourth pixels PX1 to PX4 may correspond to photoelectric conversion portions PD of FIGS. 5A to 5C.

A micro lens array layer ML may be disposed on the first to fourth pixels PX1 to PX4. A deep device isolation portion DTI may be disposed in a substrate 1 between the first to fourth pixels PX1 to PX4 and between the first to third pixel groups GRP1, GRP2 and GRP3.

Figure 4:
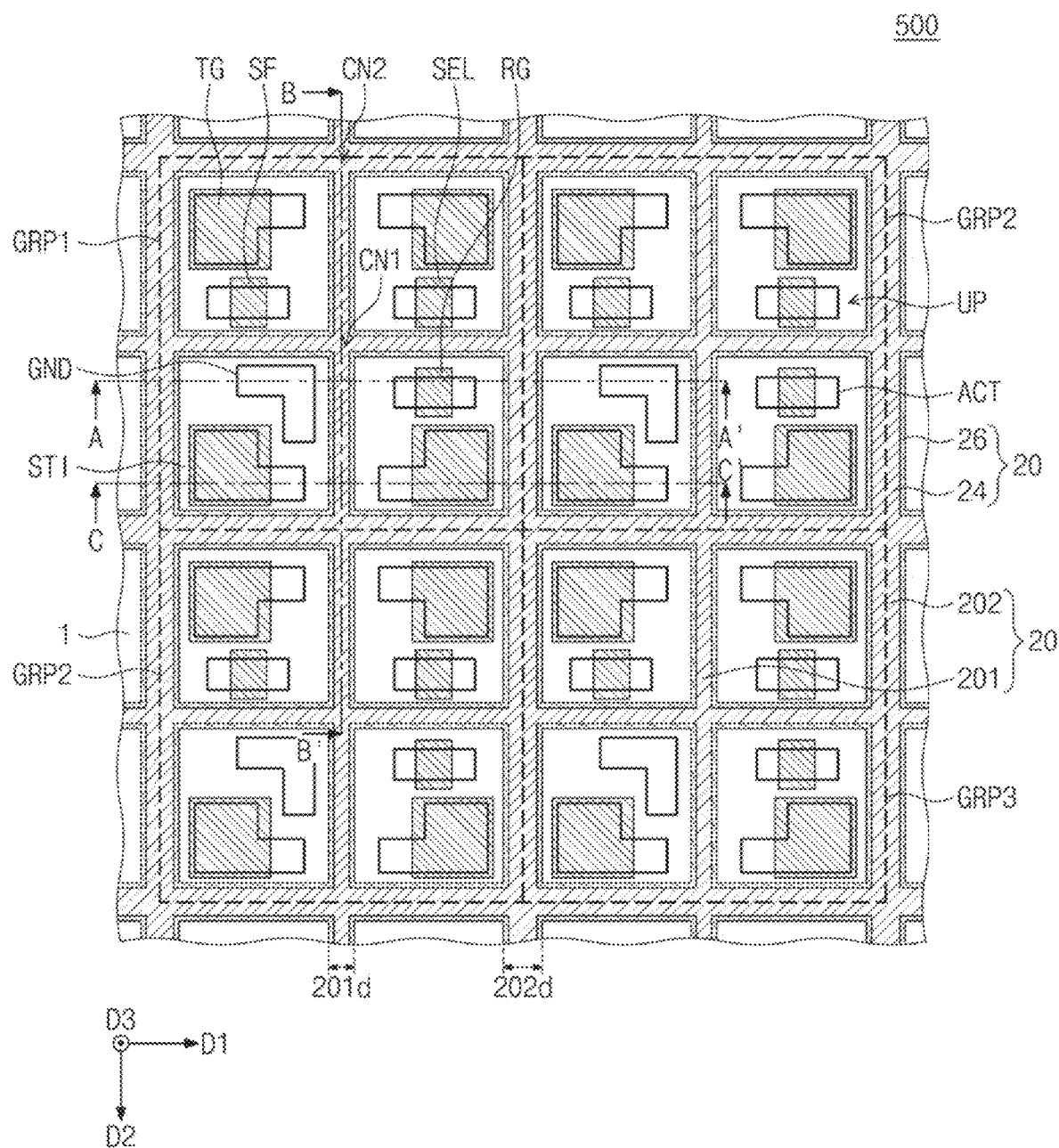
FIG. 4 is a plan view illustrating the image sensor corresponding to FIG. 3.
Figure 5A:
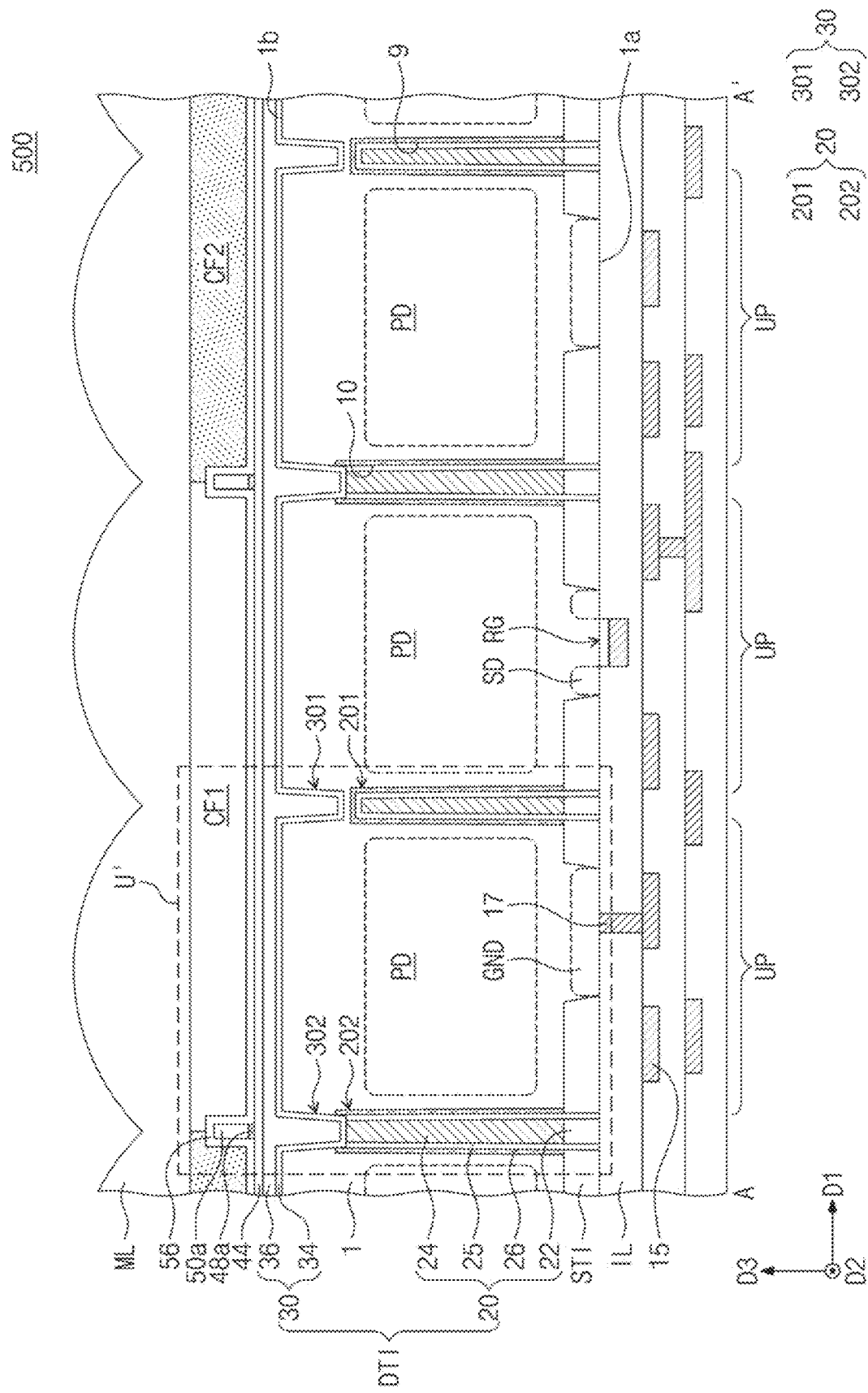
FIG. 5A is a cross-sectional view taken along a line A-A' of FIG. 4 according to some example embodiments of the inventive concepts.
Figure 5B:
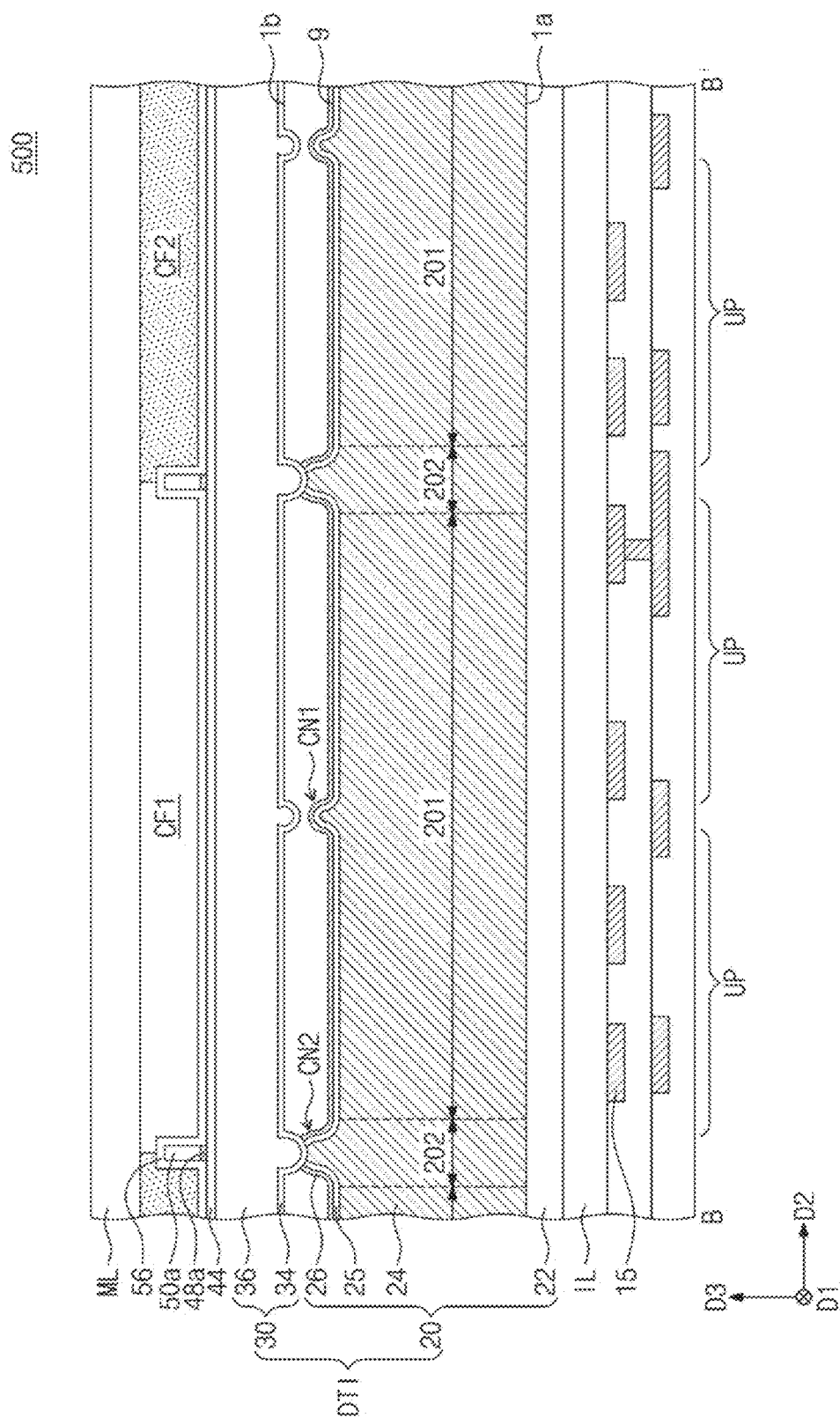
FIG. 5B is a cross-sectional view taken along a line B-B' of FIG. 4 according to some example embodiments of the inventive concepts.
Figure 5C:
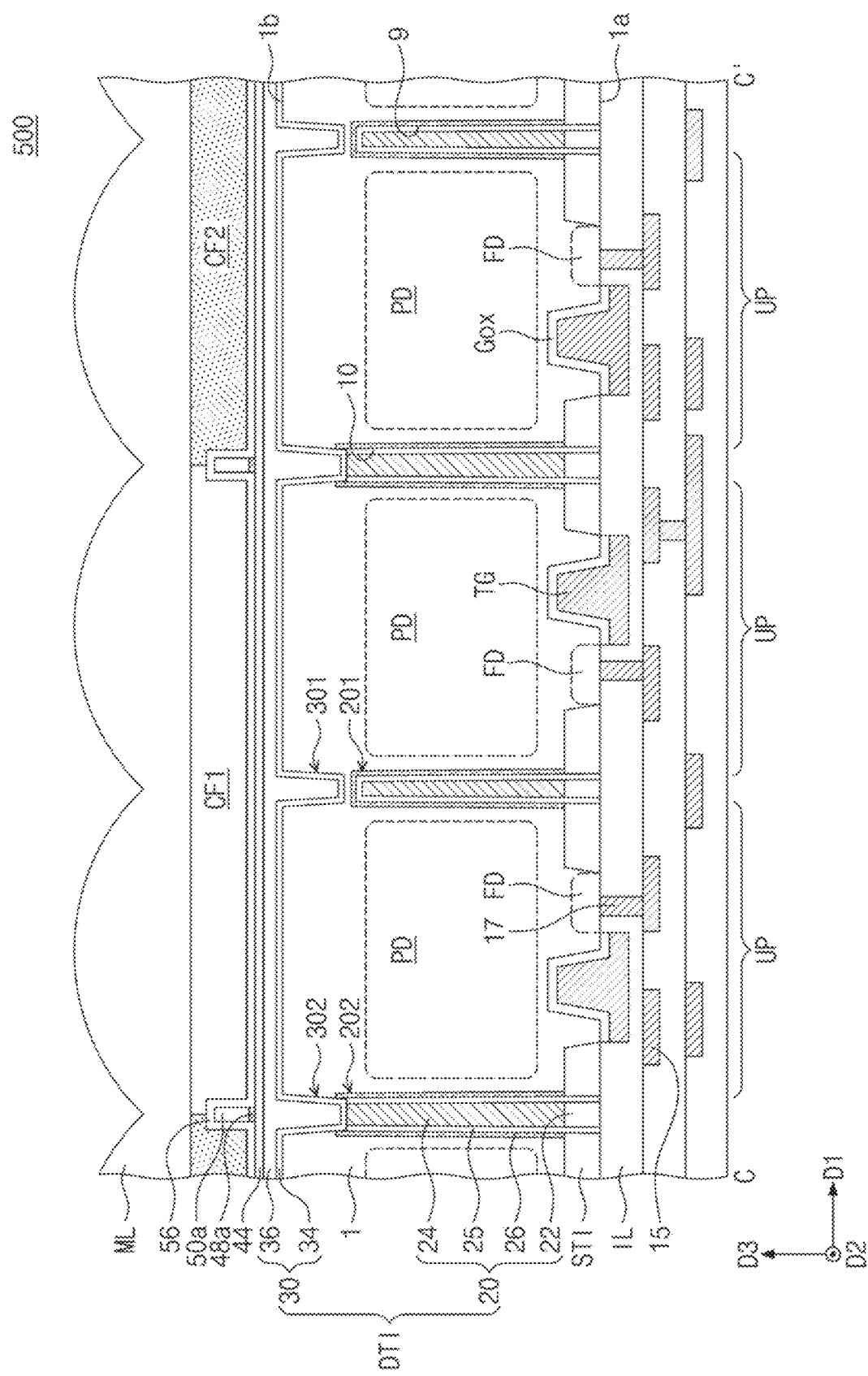
FIG. 5C is a cross-sectional view taken along a line C-C' of FIG. 4 according to some example embodiments of the inventive concepts.
Figure 6:
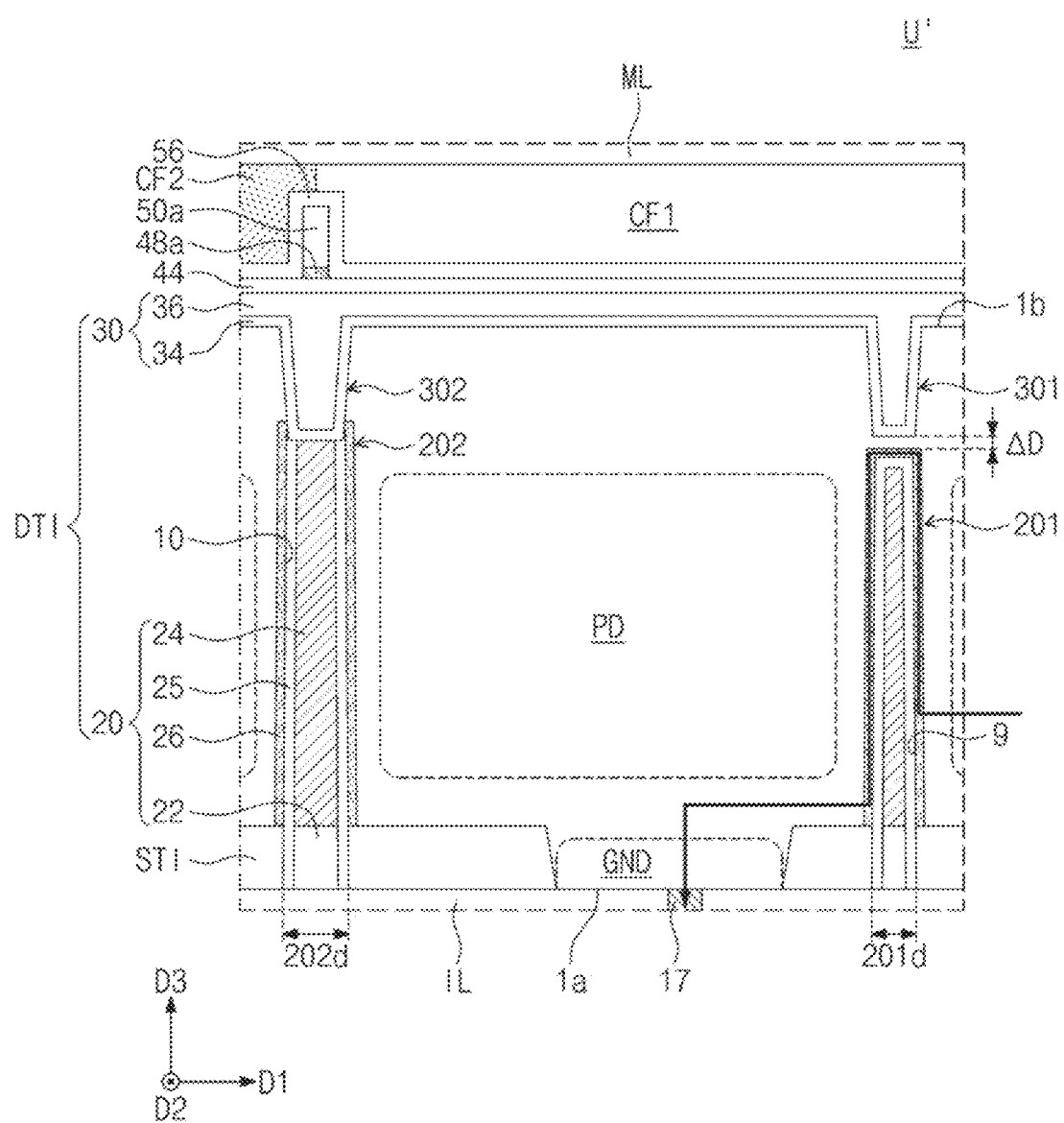
FIG. 6 is an enlarged view of a portion U' of FIG. 5A.

FIG. 4 is a plan view illustrating the image sensor corresponding to FIG. 3. FIG. 5A is a cross-sectional view taken along a line A-A' of FIG. 4 according to some example embodiments of the inventive concepts. FIG. 5B is a cross-sectional view taken along a line B-B' of FIG. 4 according to some example embodiments of the inventive concepts. FIG. 5C is a cross-sectional view taken along a line C-C' of FIG. 4 according to some example embodiments of the inventive concepts. FIG. 6 is an enlarged view of a portion U' of FIG. 5A.

Referring to FIGS. 4, 5A, 5B and 5C the image sensor 500 according to some example embodiments of the inventive concepts may include a substrate 1. For example, the substrate 1 may be a single-crystalline silicon wafer, a silicon epitaxial layer, or a silicon-on-insulator (SOI) substrate. The substrate 1 may be doped with, for example, dopants having a first conductivity type. For example, the first conductivity type may be a P-type. The substrate 1 may include a first surface 1a and a second surface 1b which are opposite to each other. The substrate 1 may include the active pixel sensor array 1001 of FIG. 1 and the first to fourth pixels PX1 to PX4 of FIG. 3 may correspond to unit pixels UP, respectively.

A deep device isolation portion DTI may be disposed in the substrate 1 to isolate/define the unit pixels UP. The deep device isolation portion DTI may have a mesh shape when viewed in a plan view.

Photoelectric conversion portions PD may be disposed in the substrate 1 of the unit pixels UP, respectively. The photoelectric conversion portions PD may be doped with dopants having a second conductivity type opposite to the first conductivity type. For example, the second conductivity type may be an N-type. The N-type dopants of the photoelectric conversion portion PD may form a PN junction with the P-type dopants of the substrate 1 around the photoelectric conversion portion PD to provide a photodiode.

A shallow device isolation portion STI adjacent to the first surface 1a may be disposed in the substrate 1. The deep device isolation portion DTI may penetrate the shallow device isolation portion STI. The shallow device isolation portion STI may define active regions ACT adjacent to the first surface 1a in each of the unit pixels UP. The active regions ACT may be provided for the transistors TX, RX, DX and SX of FIG. 2.

In each of the unit pixels UP, a transfer gate TG may be disposed on the first surface 1a of the substrate 1. A portion of the transfer gate TG may extend into the substrate 1. The transfer gate TG may be a vertical type gate. Alternatively, the transfer gate TG may be a planar type gate which does not extend into the substrate 1 but has a flat shape. A gate insulating layer Gox may be disposed between the transfer gate TG and the substrate 1. A floating diffusion region FD may be disposed in the substrate 1 at a side of the transfer gate TG. For example, the floating diffusion region FD may be doped with dopants having the second conductivity type (e.g., an N-type).

The image sensor 500 may be a backside illuminated image sensor. Light may be incident into the substrate 1 through the second surface 1b of the substrate 1. Electron-hole pairs may be generated in a depletion region of the PN junction by the incident light. The generated electrons may be moved into the photoelectric conversion portion PD. When a voltage is applied to the transfer gate TG, the electrons may be moved into the floating diffusion region FD.

In a unit pixel (a first unit pixel) UP, a ground region GND may be provided in the substrate 1 and may be adjacent to the first surface 1a and the transfer gate TG. The ground region GND may have the same conductivity type as the substrate 1. The ground region GND may be a region doped with dopants having the first conductivity type. In another unit pixel (a second unit pixel) UP, a reset gate RG may be disposed adjacent to the transfer gate TG on the first surface 1a. In still another unit pixel (a third unit pixel) UP, a source follower gate SF may be disposed adjacent to the transfer gate TG on the first surface 1a. In yet another unit pixel (a fourth unit pixel) UP, a selection gate SEL may be disposed adjacent to the transfer gate TG on the first surface 1a. The gates TG, RG, SF and SEL may correspond to the gate electrodes of the transistors TX, RX, DX and SX of FIG. 2, respectively. Source/drain regions SD may be provided at both sides of each of the reset gate RG, the source follower gate SF and the selection gate SEL. The ground region GND and the gates TG, RG, SF and SEL may overlap with the active regions ACT. The first to fourth unit pixels UP may constitute a pixel group (e.g., GRP1, GRP2 or GRP3).

The first surface 1a may be covered by first interlayer insulating layers IL. Each of the first interlayer insulating layers IL may be formed of at least one of a silicon oxide layer, a silicon nitride layer, a silicon oxynitride layer, or a porous low-k dielectric layer. Interconnection lines 15 may be disposed between or in the first interlayer insulating layers IL. The ground region GND may be electrically connected to a corresponding contact plug 17 of contact plugs 17 and a corresponding interconnection line 15 of the interconnection lines 15. The contact plugs 17 may penetrate a first interlayer insulating layer IL, closest to the first surface 1a, of the first interlayer insulating layers IL. A ground voltage may be applied to the substrate 1 through the corresponding interconnection line 15 and the ground region GND. The ground region GND may be disposed adjacent to the deep device isolation portion DTI. A layout shape of the ground region GND may be variously modified, and the ground region GND may have a shape such as a L-shape or an inverted L-shape. The floating diffusion region FD may be electrically connected to a corresponding contact plug 17 of the contact plugs 17 and a corresponding interconnection line 15 of the interconnection lines 15.

The deep device isolation portion DTI may include a first isolation portion 20 and a second isolation portion 30. The first isolation portion 20 may include a first isolation pattern 201 and a second isolation pattern 202. The second isolation portion 30 may include a third isolation pattern 301 and a fourth isolation pattern 302. The first isolation portion 20 may extend from the first surface 1a toward the second surface 1b. The second isolation portion 30 may extend from the second surface 1b toward the first surface 1a.

The first isolation portion 20 may include the first isolation pattern 201 and the second isolation pattern 202. The first isolation pattern 201 may be provided between two adjacent unit pixels UP in each of the pixel groups GRP1, GRP2 and GRP3. The second isolation pattern 202 may be provided between the pixel groups GRP1, GRP2 and GRP3.

A width 201d of the first isolation pattern 201 in the first direction D1 may be less than a width 202d of the second isolation pattern 202 in the first direction D1. The first isolation pattern 201 may extend less from the first surface 1a toward the second surface 1b than the second isolation pattern 202. In other words, a length of the first isolation pattern 201 may be less than a length of the second isolation pattern 202. The lengths of the first isolation pattern 201 and the second isolation pattern 202 may mean lengths from the first surface 1a of the substrate 1 in a third direction D3 perpendicular to the first surface 1a.

The second isolation portion 30 may include the third isolation pattern 301 and the fourth isolation pattern 302. The third isolation pattern 301 may be provided between two adjacent unit pixels UP in each of the pixel groups GRP1, GRP2 and GRP3. The fourth isolation pattern 302 may be provided between the pixel groups GRP1, GRP2 and GRP3.

The first isolation pattern 201 and the third isolation pattern 301 may vertically overlap (or be aligned) with each other and may be spaced apart from each other. A distance ΔD between the first isolation pattern 201 and the third isolation pattern 301 may range from 100 nm to 300 nm (see FIG. 6). The second isolation pattern 202 and the fourth isolation pattern 302 may vertically overlap (or be aligned) with each other and may be in contact with each other.

The first isolation portion 20 may include a filling insulation pattern 22, a conductive pattern 24, a liner insulating pattern 25, and a high-concentration doped pattern 26. The filling insulation pattern 22 may be disposed on the interlayer insulating layer IL. The conductive pattern 24 may be provided on the filling insulation pattern 22 and may be spaced apart from the interlayer insulating layer IL with the filling insulation pattern 22 interposed therebetween. The liner insulating pattern 25 may be disposed between the conductive pattern 24 and the substrate 1 and between the filling insulation pattern 22 and the shallow device isolation portion STI.

The filling insulation pattern 22 and/or the liner insulating pattern 25 may include, for example, silicon oxide. The conductive pattern 24 may be spaced apart from the substrate 1. The conductive pattern 24 may include a polysilicon layer or silicon-germanium layer doped with dopants. For example, the dopants doped in the poly-silicon layer or silicon-germanium layer may include boron, phosphorus, or arsenic.

The filling insulation pattern 22, the conductive pattern 24 and the liner insulating pattern 25 may fill a first deep trench 9 and a second deep trench 10. The high-concentration doped pattern 26 may be formed in inner surface regions of the first deep trench 9 and the second deep trench 10. The high-concentration doped pattern 26 may be a region of the substrate 1, which is doped with dopants having the first conductivity type. The high-concentration doped pattern 26 may have a dopant concentration higher than a dopant concentration of the substrate 1 and may have, for example, a dopant concentration of $1\times10^{17}/cm^3$ to $1\times10^{19}/cm^3$.

The second isolation portion 30 may include a first fixed charge layer 34 and an insulating pattern 36. The first fixed charge layer 34 may be formed of a single layer or multi-layer including at least one of a metal oxide layer containing insufficient oxygen in terms of a stoichiometric ratio or a metal fluoride layer containing insufficient fluorine in terms of a stoichiometric ratio. Thus, the first fixed charge layer 34 may have negative fixed charges. The first fixed charge layer 34 may be formed of a single layer or multi-layer of a metal oxide or metal fluoride including at least one metal selected from a group consisting of hafnium (Hf), zirconium (Zr), aluminum (Al), tantalum (Ta), titanium (Ti), yttrium (Y), and a lanthanoid. For example, the first fixed charge layer 34 may include hafnium oxide and/or aluminum oxide. A dark current and a white spot may be reduced by the first fixed charge layer 34. The insulating pattern 36 may be provided on the first fixed charge layer 34. For example, the insulating pattern 36 may include silicon oxide.

The first fixed charge layer 34 may be in contact with a surface of the substrate 1. The first fixed charge layer 34 may cover a trench formed in the second surface 1b of the substrate 1. The first fixed charge layer 34 may be in contact with the liner insulating pattern 25 and/or the conductive pattern 24 of the second isolation pattern 202. The high-concentration doped pattern 26 of the second isolation pattern 202 may not be connected by the first fixed charge layer 34. On the contrary, the high-concentration doped pattern 26 of the first isolation pattern 201 may be continuous between adjacent unit pixels UP.

Like FIG. 5B, a first distance from the second surface 1b to a top surface of the first isolation pattern 201 between two neighboring unit pixels UP in the pixel group (e.g., GRP1) may be greater than a second distance from the second surface 1b to a top surface of the first isolation pattern 201 in a place CN1 in which four neighboring unit pixels UP in the pixel group (e.g., GRP1, GRP2 or GRP3) are adjacent to each other. In addition, a lowermost level of the second surface 1b in a place CN2 in which four neighboring unit pixels UP between adjacent pixel groups (e.g., GRP1 and GRP2) are adjacent to each other may be lower than a level of a top surface of the second isolation pattern 202.

According to some example embodiments of the inventive concepts, the pixels included in each of the pixel groups (e.g., GRP1, GRP2 and GRP3) may share the ground region GND. For example, in the case in which four pixels constitute a single pixel group like FIGS. 3 and 4, the ground region GND may be selectively provided in one (e.g., PX2) of the four pixels. Since the first isolation pattern 201 and the third isolation pattern 301 are not in contact with each other, positive charges of pixels (e.g., PX1, PX3 and PX4) in which the ground region GND is not provided may be moved into the pixel (e.g., PX2) having the ground region GND through the continuous high-concentration doped pattern 26 of the first isolation pattern 201 (see FIG. 6). As a result, the positive charges of the three pixels may be discharged into the ground region GND through the first isolation pattern 201 even though the three pixels do not have the ground region GND. In addition, since the three pixels do not require the ground region GND, areas of the gate TG, RG, SEL and SF may be increased. For example, a planar area of the transfer gate TG may be 10% or more of an area of the unit pixel.

According to some example embodiments of the inventive concepts, since the second isolation pattern 202 and the fourth isolation pattern 302 are in contact with each other between the pixel groups, received light may not move into other pixel group(s) (see FIG. 6). Thus, it is possible to prevent or reduce cross-talk between neighboring pixels having color filters of which colors are different from each other.

A first protective layer 44 may be provided on the second surface 1b. In some example embodiments, a second fixed charge layer may be disposed between the first protective layer 44 and the insulating pattern 36. The second fixed charge layer may include a single layer or multi-layer of a metal oxide or a metal fluoride. For example, the second fixed charge layer may include hafnium oxide and/or aluminum oxide. The second fixed charge layer may reinforce the first fixed charge layer 34 and/or may function as an adhesive layer. The first protective layer 44 may include at least one of PETEOS, SiOC, $SiO_2$, or SiN. The first protective layer 44 may function as an anti-reflection layer and/or a planarization layer.

A light blocking pattern 48a and a low-refractive index pattern 50a may be sequentially stacked on the first protective layer 44. The light blocking pattern 48a and the low-refractive index pattern 50a may have mesh shapes in a plan view and may overlap with the deep device isolation portion DTI. The light blocking pattern 48a may include, for example, titanium. The low-refractive index pattern 50a may include an organic material. The low-refractive index pattern 50a may have a refractive index less than those of color filters CF1, CF2 and CF3. For example, the low-refractive index pattern 50a may have a refractive index of about 1.3 or less. A side surface of the low-refractive index pattern 50a may be aligned with a side surface of the light blocking pattern 48a. The light blocking pattern 48a and the low-refractive index pattern 50a may prevent or reduce cross-talk between adjacent pixels.

A second protective layer 56 may be stacked on the first protective layer 44. The second protective layer 56 may conformally cover the low-refractive index pattern 50a and the light blocking pattern 48a. Color filters CF1, CF2 and CF3 may be disposed in openings of the low-refractive index pattern 50a having the mesh shape. A micro lens array layer ML may be disposed on the color filters CF1, CF2 and CF3. The micro lens array layer ML may include convex lens portions overlapping with the unit pixels UP, respectively.

Figure 7:
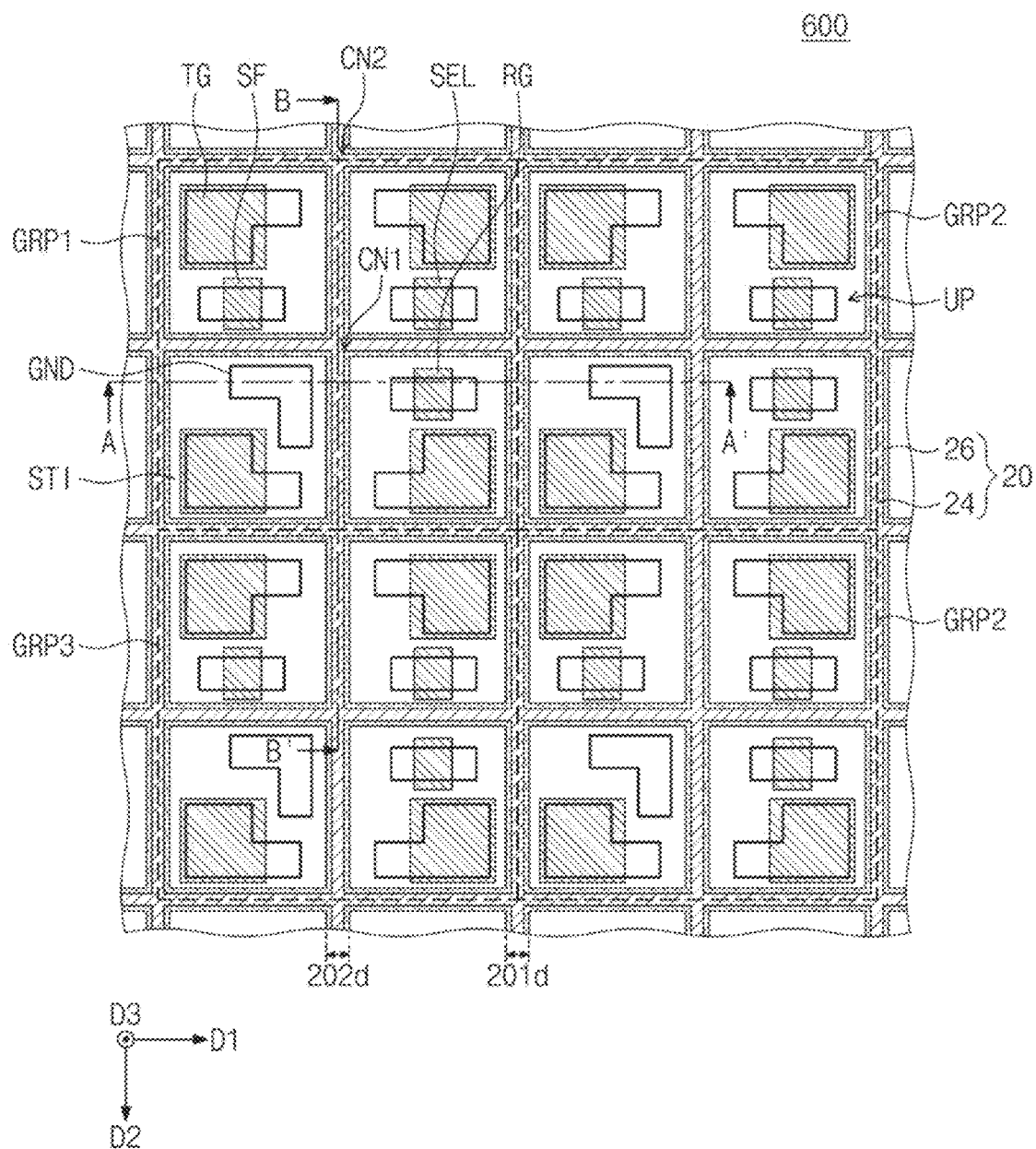
FIG. 7 is a plan view illustrating an image sensor according to some example embodiments of the inventive concepts.
Figure 8A:
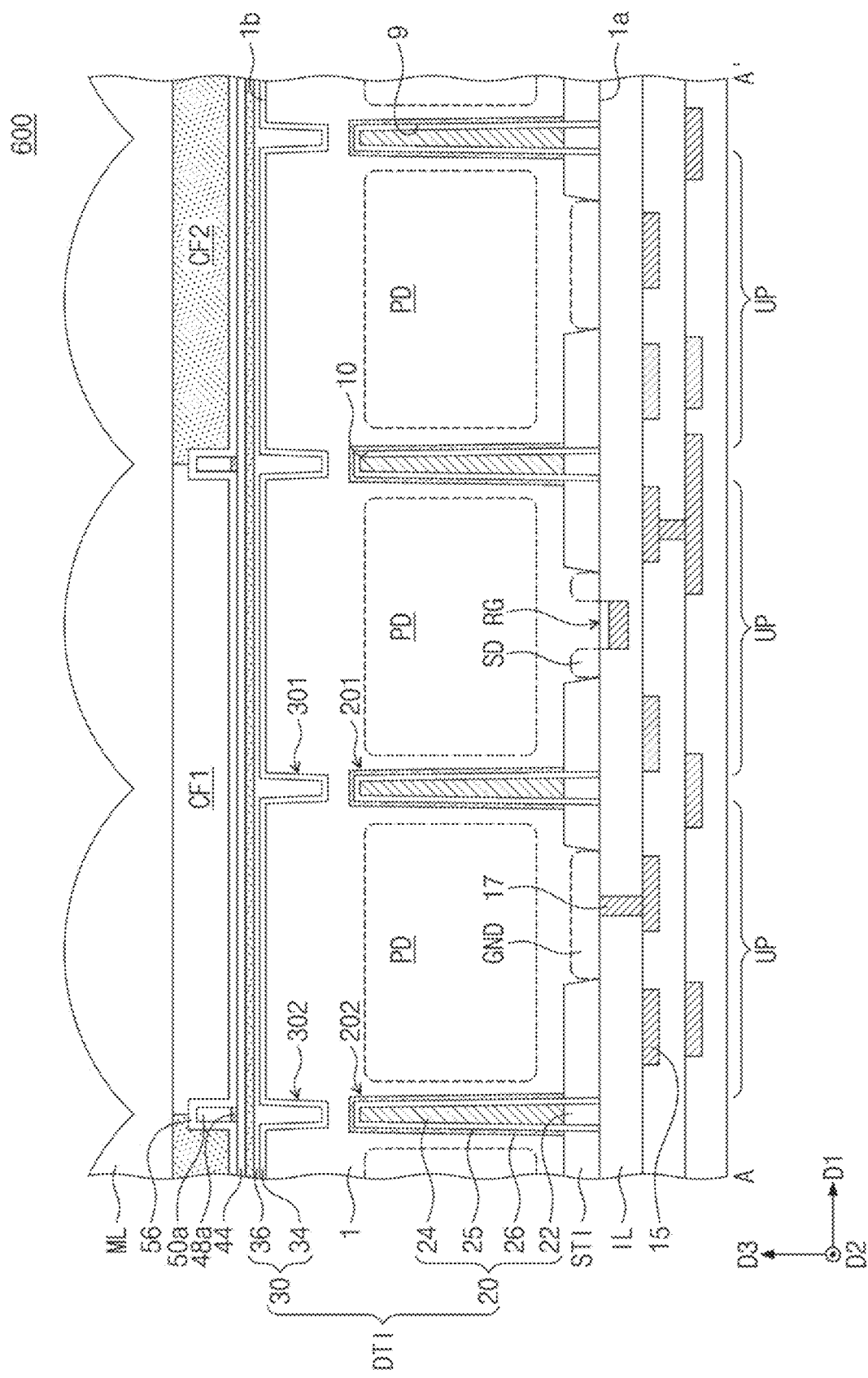
FIG. 8A is a cross-sectional view taken along a line A-A' of FIG. 7 according to some example embodiments of the inventive concepts.
Figure 8B:
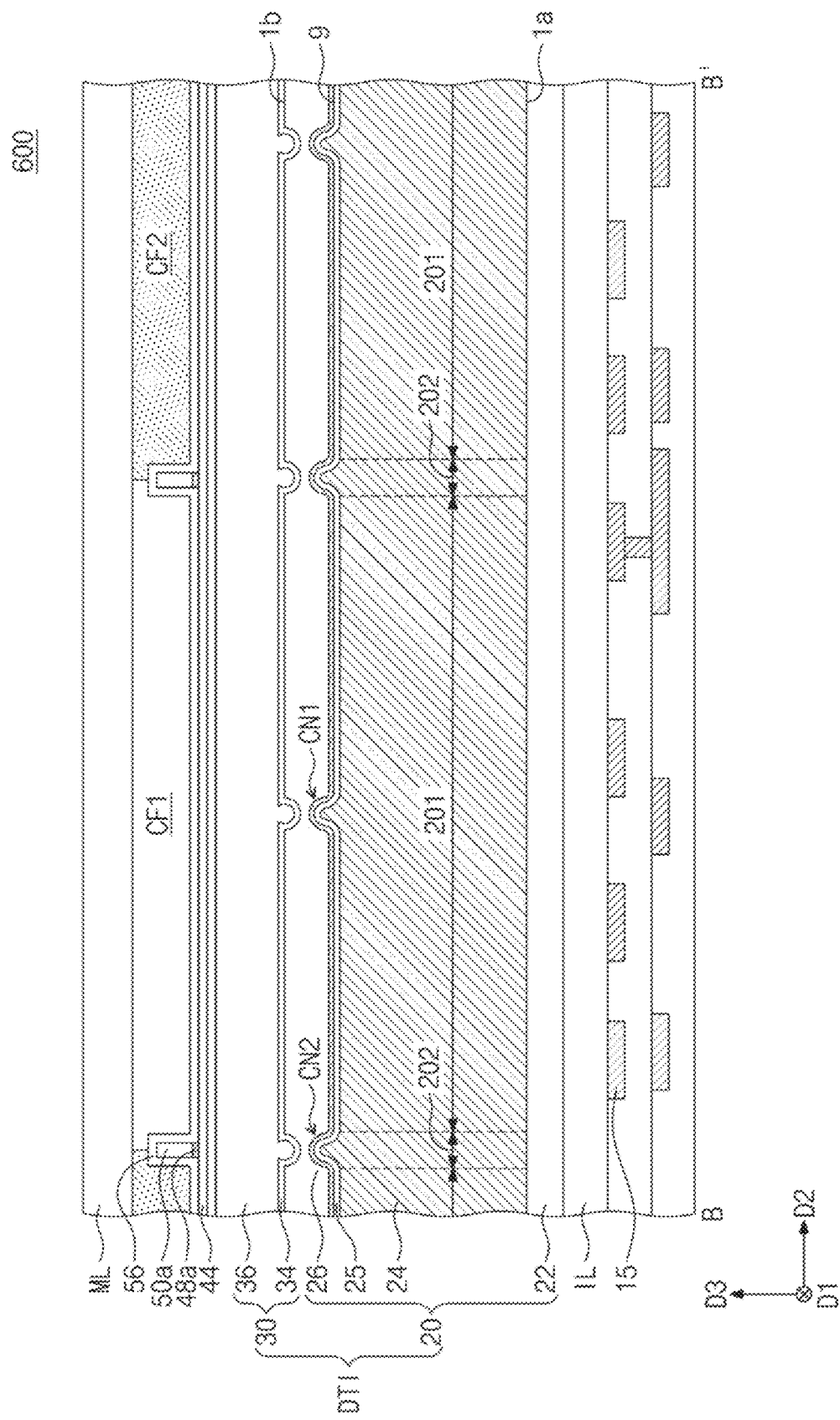
FIG. 8B is a cross-sectional view taken along a line B-B' of FIG. 7 according to some example embodiments of the inventive concepts.

FIG. 7 is a plan view illustrating an image sensor according to some example embodiments of the inventive concepts. FIG. 8A is a cross-sectional view taken along a line A-A' of FIG. 7 according to some example embodiments of the inventive concepts. FIG. 8B is a cross-sectional view taken along a line B-B' of FIG. 7 according to some example embodiments of the inventive concepts. Hereinafter, the descriptions to the same features as in the example embodiments of FIGS. 4 to 6 will be omitted and differences between the example embodiments of FIGS. 7 to 8B and the example embodiments of FIGS. 4 to 6 will be mainly described, for the purpose of ease and convenience in explanation.

Referring to FIGS. 7, 8A and 8B, a width 202d of the second isolation pattern 202 in the first direction D1 may be substantially equal to a width 201d of the first isolation pattern 201 in the first direction D1. An extending depth of the second isolation pattern 202 from the first surface 1a toward the second surface 1b may be substantially equal to an extending depth of the first isolation pattern 201 from the first surface 1a toward the second surface 1b. In other words, a length of the second isolation pattern 202 may be substantially equal to a length of the first isolation pattern 201.

The first isolation pattern 201 and the third isolation pattern 301 may vertically overlap (or be aligned) with each other and may be spaced apart from each other. The second isolation pattern 202 and the fourth isolation pattern 302 may vertically overlap (or be aligned) with each other and may be spaced apart from each other.

As illustrated in FIG. 8B, a lowermost level of the second surface 1b in the place CN2 in which the four neighboring unit pixels UP between the adjacent pixel groups (e.g., GRP1 and GRP2) are adjacent to each other may be higher than the level of the top surface of the second isolation pattern 202. Thus, the high-concentration doped pattern 26 of the first isolation pattern 201 may be connected to the high-concentration doped pattern 26 of the second isolation pattern 202.

In other words, according to the inventive concepts, positive charges of the pixel, not having the ground region GND, in the first pixel group GRP1 may be moved into the ground region GND of the second pixel group GRP2 through the continuous high-concentration doped pattern 26 of the first isolation pattern 201 and the continuous high-concentration doped pattern 26 of the second isolation pattern 202. Since the number of the pixels sharing the ground region GND is increased as described above, areas of the gates TG, RG, SEL and SF of the sharing pixels may be increased.

Figure 9:
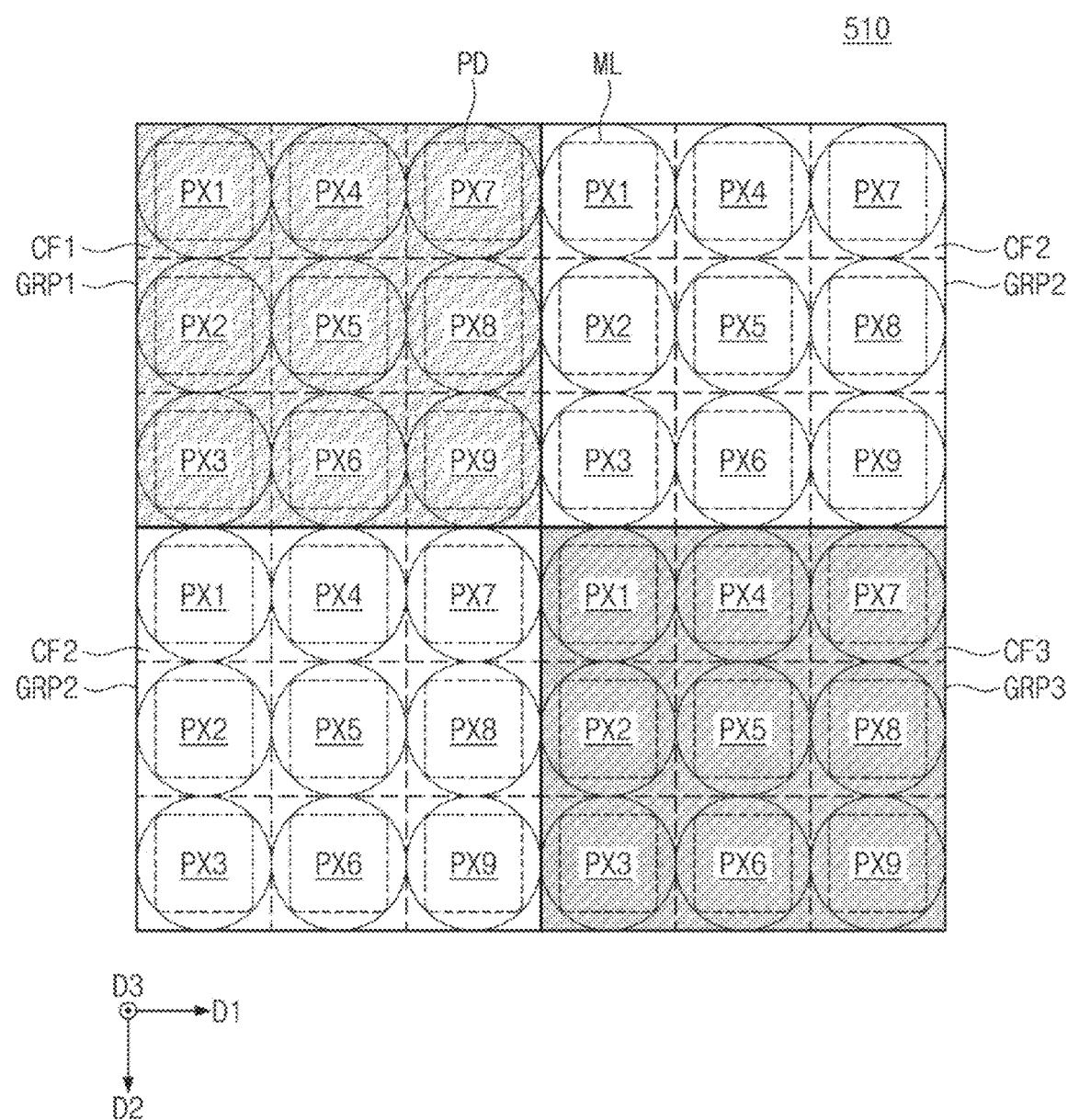
FIG. 9 is a plan view illustrating an image sensor according to some example embodiments of the inventive concepts.

FIG. 9 is a plan view illustrating an image sensor according to some example embodiments of the inventive concepts.

Referring to FIG. 9, each of first to third pixel groups GRP1, GRP2 and GRP3 may include first to ninth pixels PX1 to PX9 arranged in a 3×3 matrix form consisting of three rows arranged in the second direction D2 and three columns arranged in the first direction D1.

An image sensor 510 according to some example embodiments may also have the pixels sharing the ground region GND in the same pixel group and the structural features of the deep device isolation portion DTI, described with reference to FIGS. 3 to 8.

In some example embodiments, each of first to third pixel groups GRP1, GRP2 and GRP3 may include first to sixteenth pixels arranged in a 4×4 matrix form consisting of four rows arranged in the second direction D2 and four columns arranged in the first direction D1.

FIGS. 10A to 19A are cross-sectional views corresponding to the line A-A' of FIG. 4 to illustrate a method of manufacturing the image sensor of FIG. 5A. FIGS. 10B to 19B are cross-sectional views corresponding to the line B-B' of FIG. 4 to illustrate a method of manufacturing the image sensor of FIG. 5B.

Figure 10A:
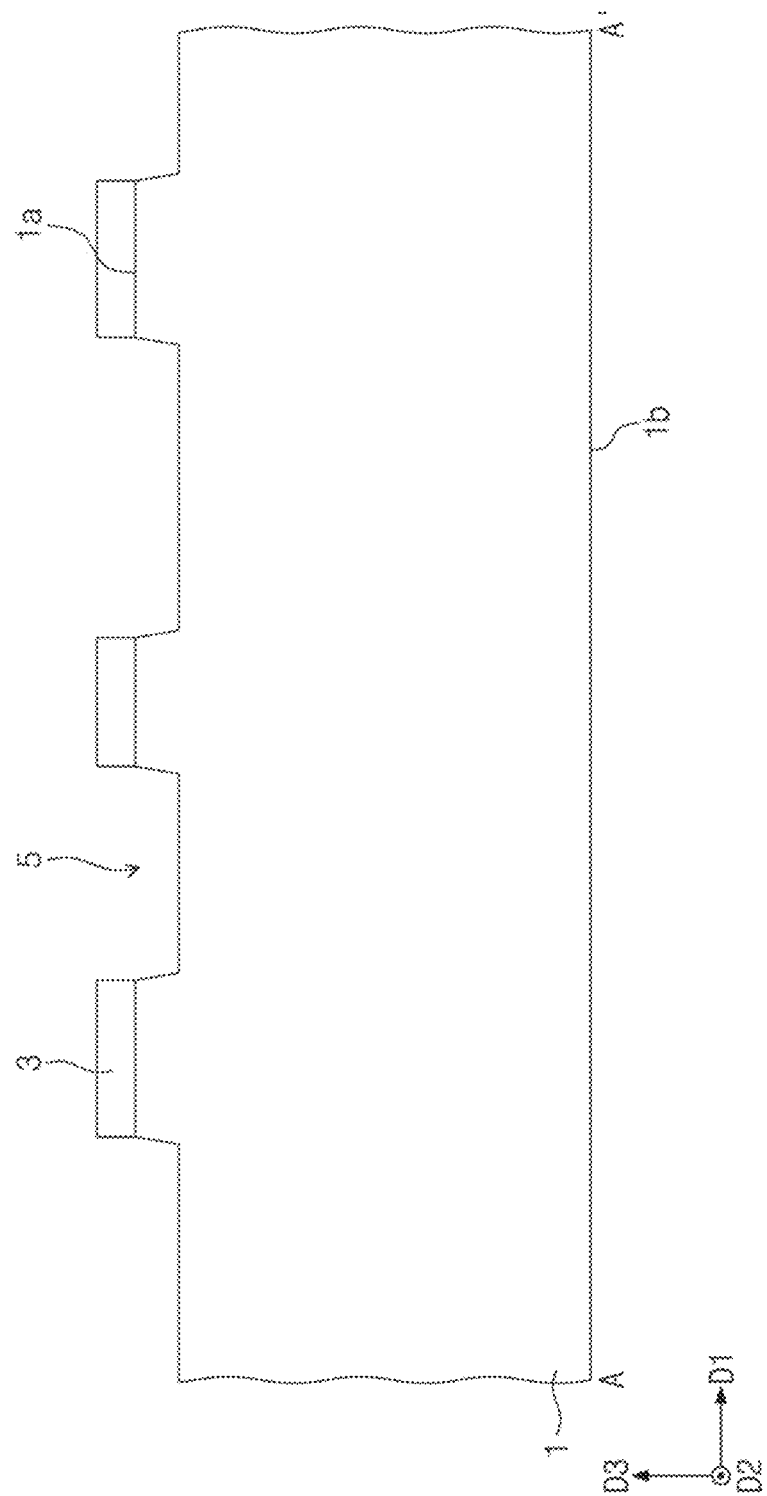
Figure 10B:
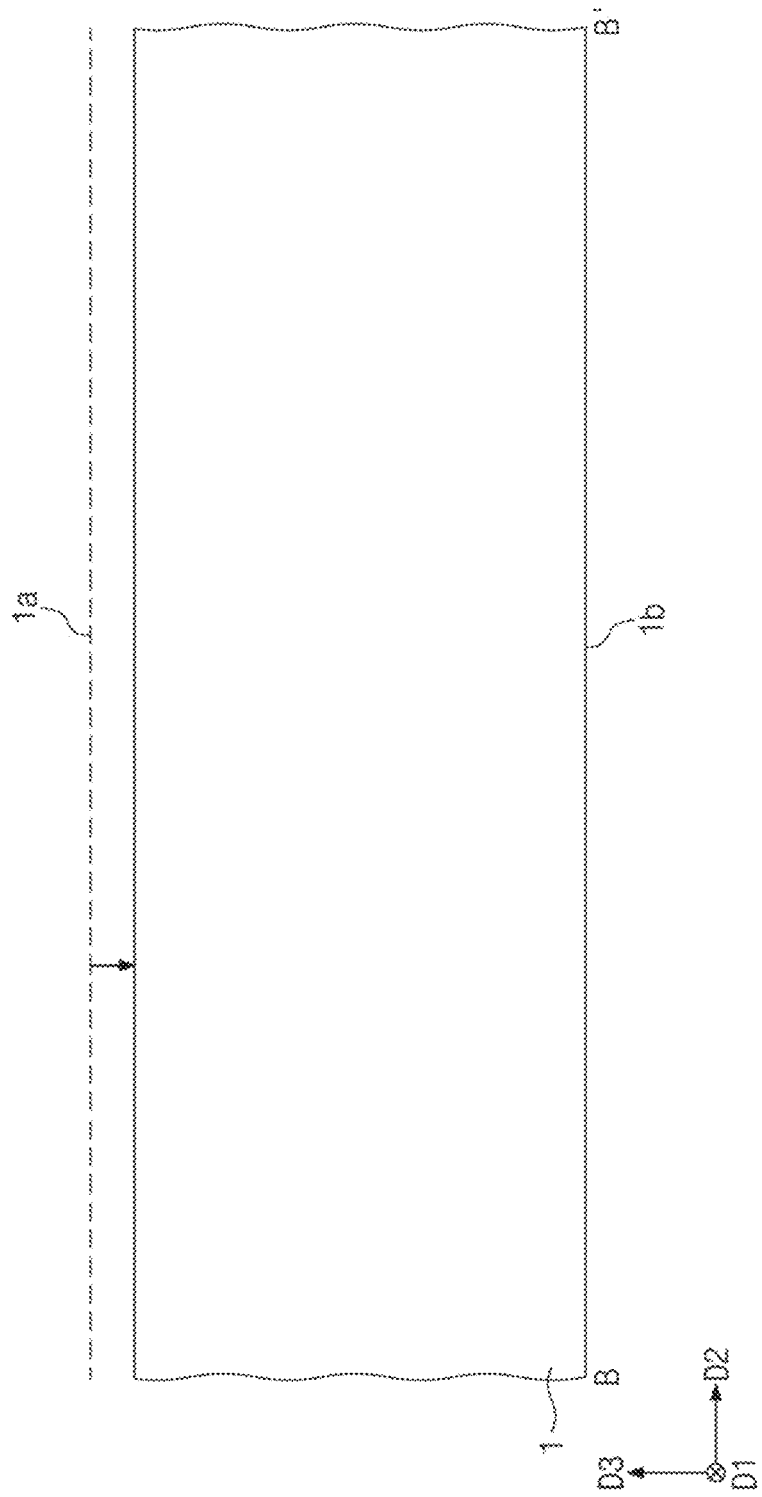

Referring to FIGS. 10A and 10B, a substrate 1 may be prepared. An etching process may be performed on the substrate 1 by using a first etch mask pattern 3, thereby forming a first trench 5.

Figure 11A:
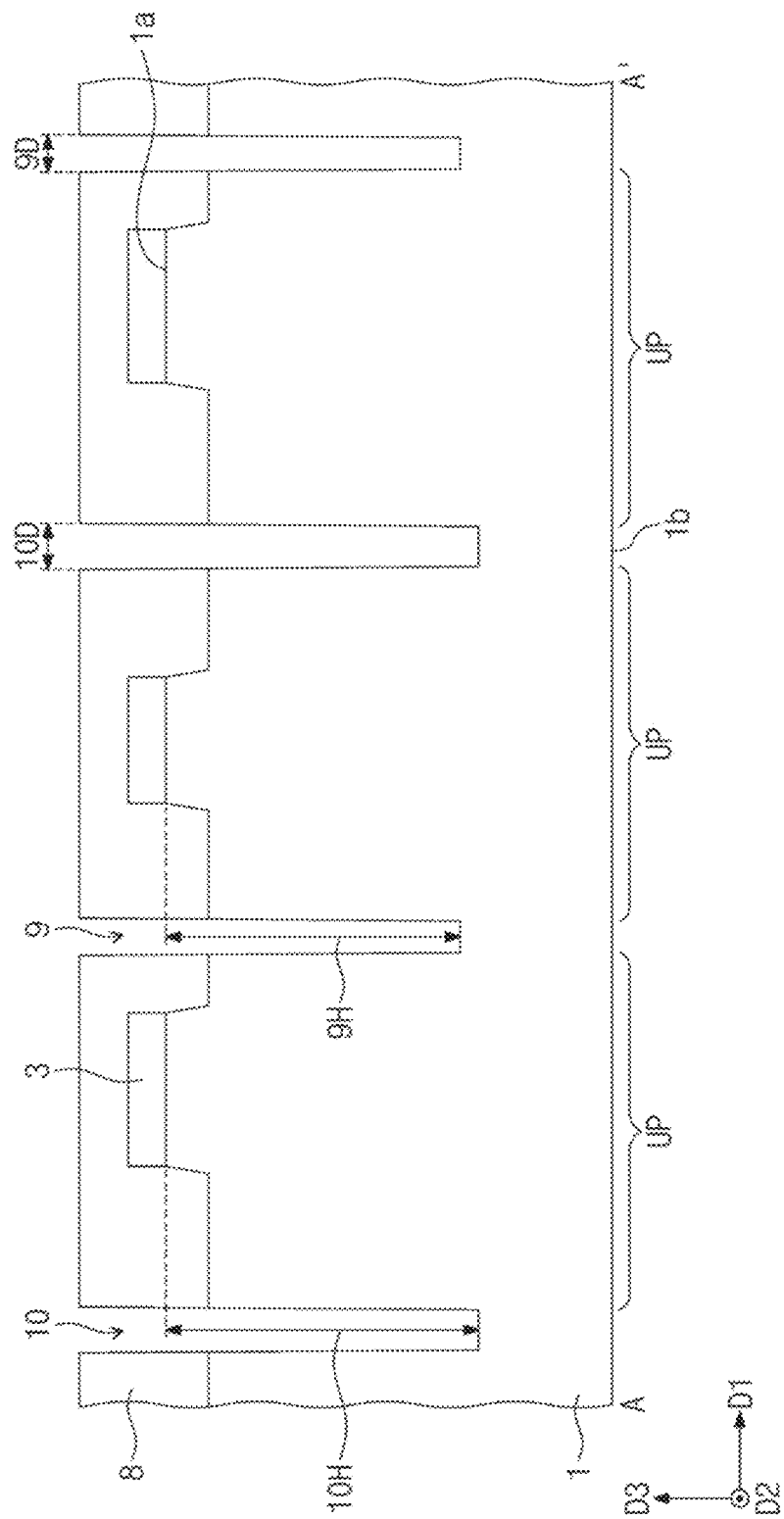
Figure 11B:
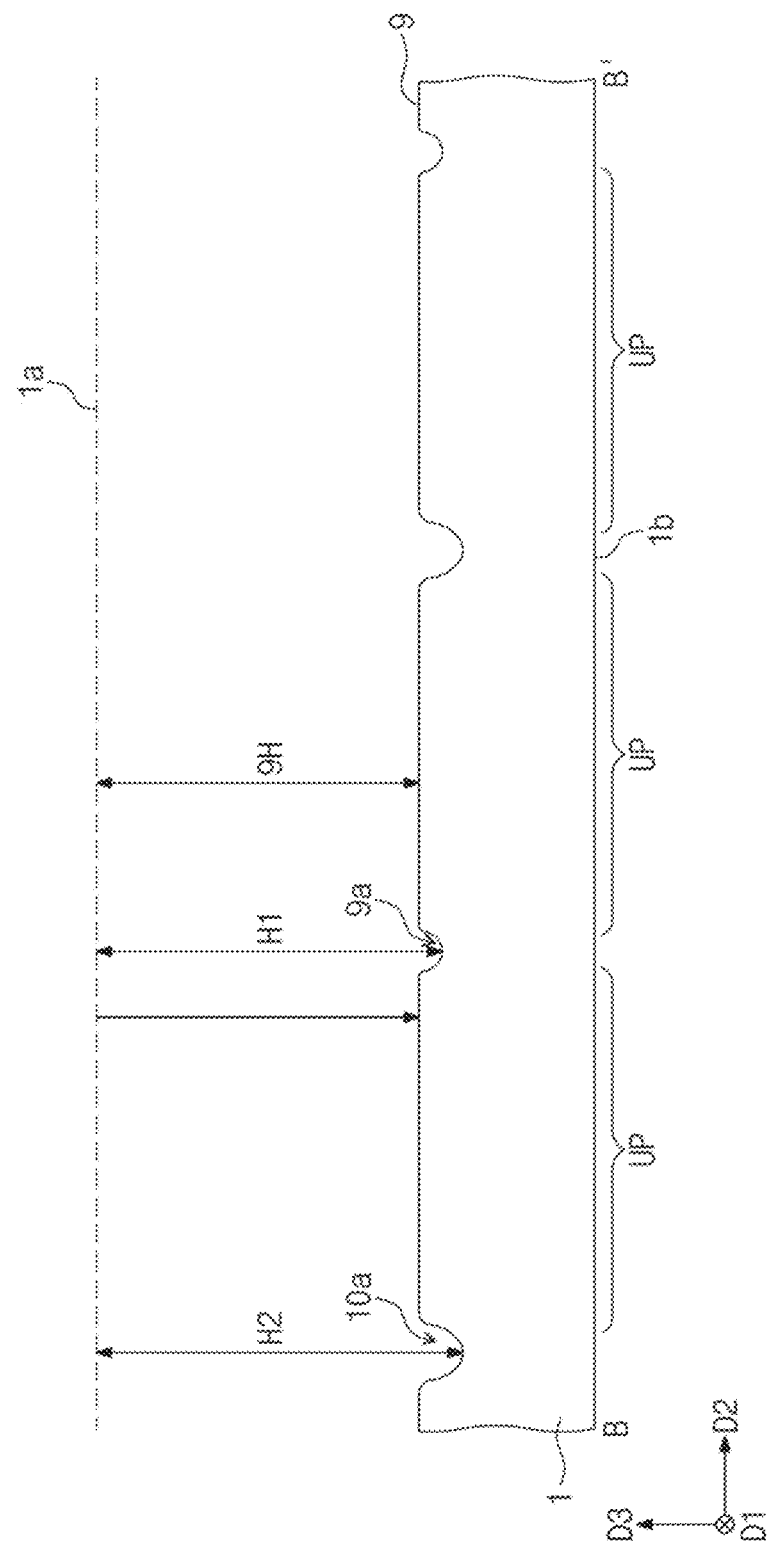

Referring to FIGS. 11A and 11B, a first insulating layer 8 may be formed to cover a first surface 1a of the substrate 1. The first insulating layer 8 may fill the first trench 5. For example, the first insulating layer 8 may include a silicon oxide layer. Next, a first deep trench 9 and a second deep trench 10 may be formed to penetrate the first trench 5. The formation of the first deep trench 9 and the second deep trench 10 may include a process of forming a second etch mask pattern, and a process of etching the first insulating layer 8 and the substrate 1 by using the second etch mask pattern. The first deep trench 9 and the second deep trench 10 may be formed to have a mesh shape in which grooves intersect each other. A width 9D of the first deep trench 9 in the first direction D1 may be less than a width 10D of the second deep trench 10 in the first direction D1. A depth 9H of the first deep trench 9 may be less than a depth 10H of the second deep trench 10 (loading effect).

At this time, an etched amount of the substrate 1 between four neighboring pixels UP may be more than an etched amount of the substrate 1 between two neighboring pixels UP. In other words, the etched amount of the substrate 1 may be more in a place 9a in which a pair of the first deep trenches 9 intersect each other and a place 10a in which the second deep trench 10 intersects the first deep trench 9 or the second deep trench 10. An etched amount H2 of the substrate 1 in the place 10a in which the second deep trench 10 intersects the first deep trench 9 or the second deep trench 10 may be more than an etched amount H1 of the substrate 1 in the place 9a in which the pair of first deep trenches 9 intersect each other (loading effect).

Figure 12A:
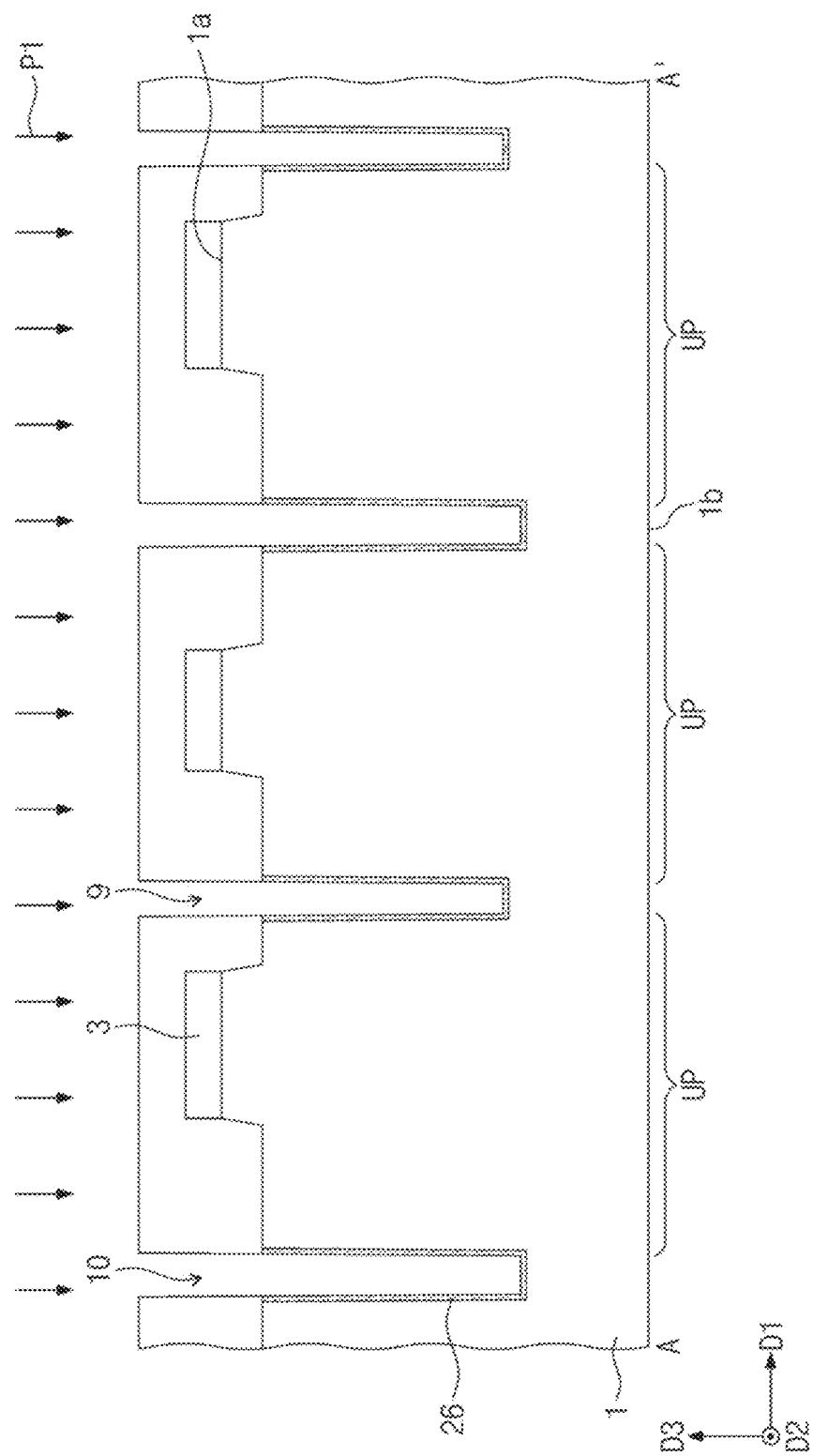
Figure 12B:
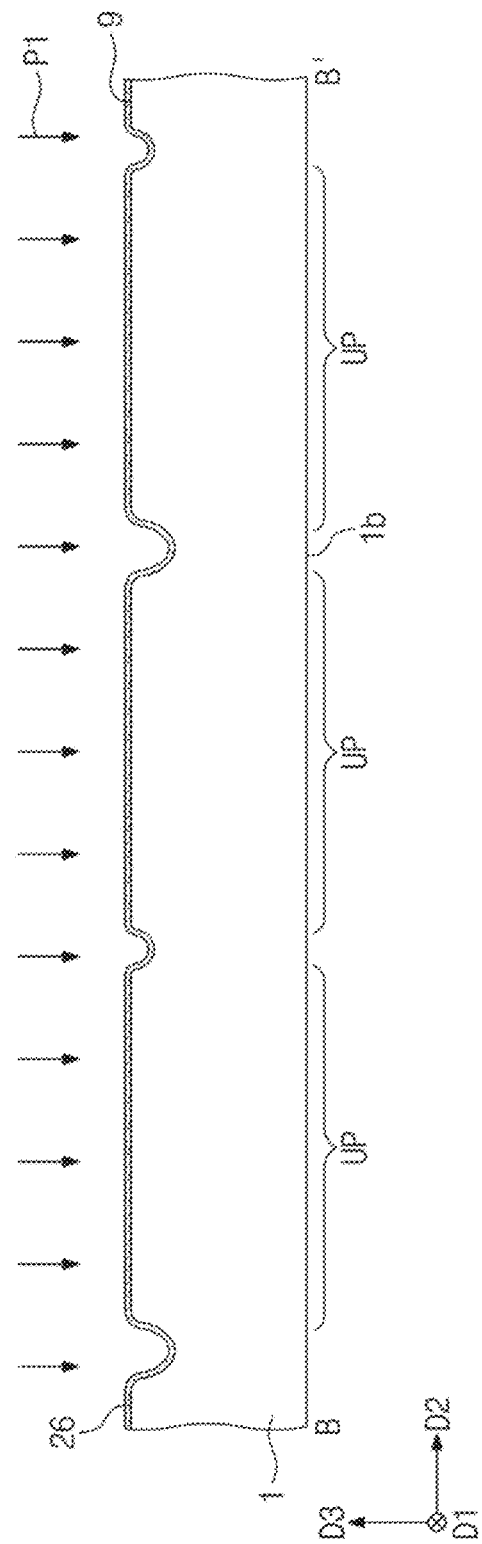

Referring to FIGS. 12A and 12B, dopants having a first conductivity type (e.g., a P-type) may be injected into a portion of the substrate 1 by a plasma doping (PLAD) process P1 performed from the first surface 1a toward a second surface 1b of the substrate 1. For example, the dopants having the first conductivity type may include boron. A high-concentration doped pattern 26 may be formed in an inner surface of each of the first and second deep trenches 9 and 10 by the plasma doping process P1.

Figure 13A:
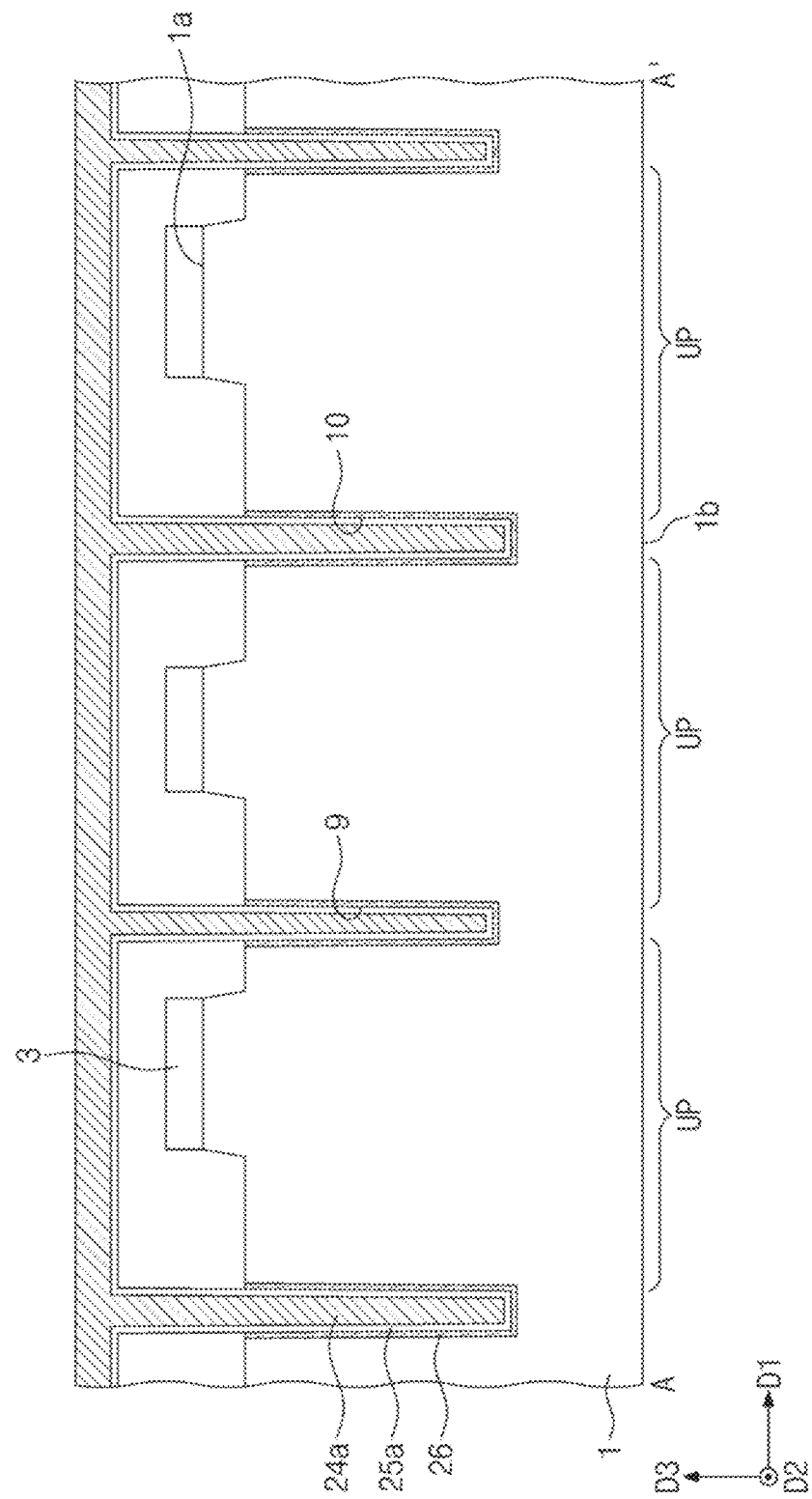
Figure 13B:
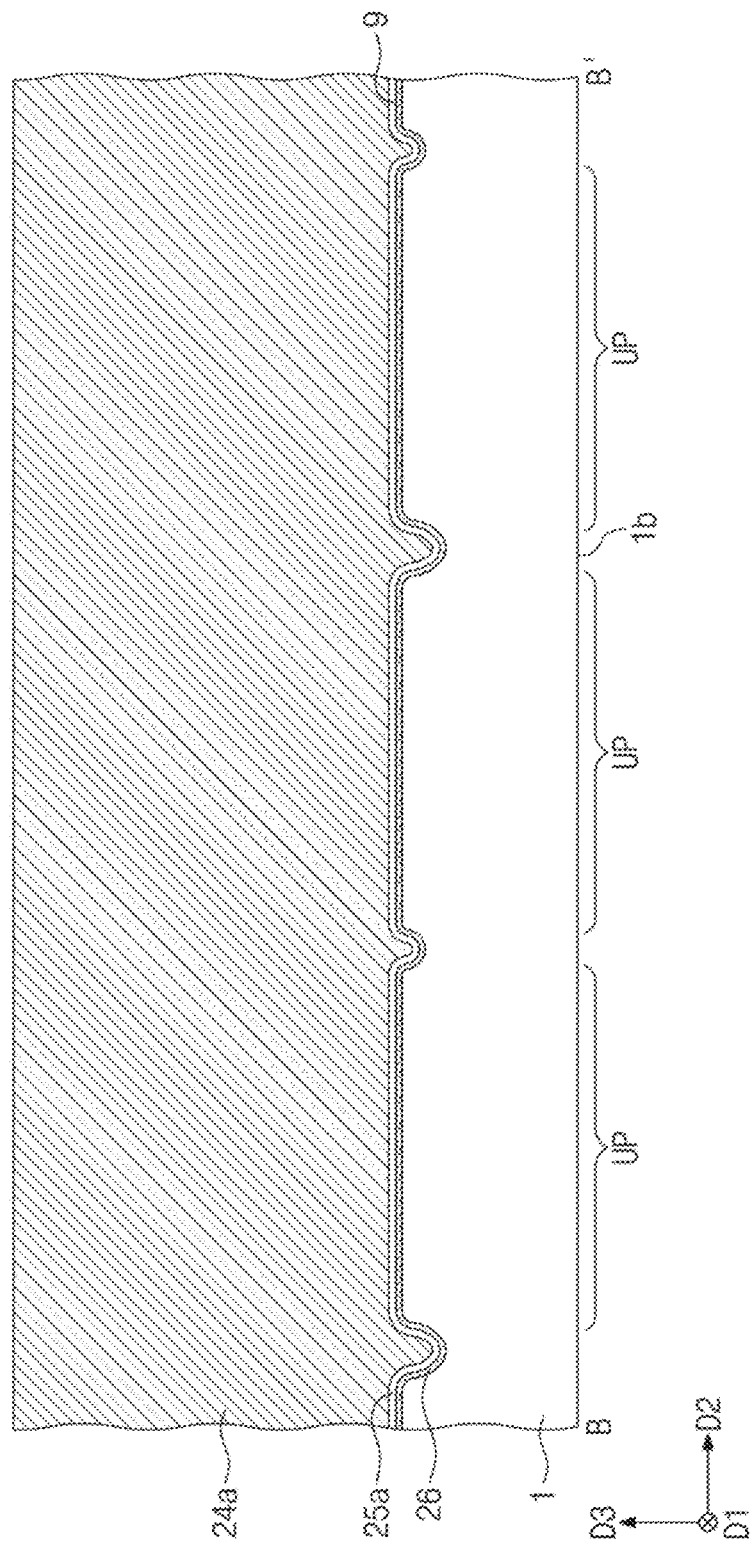

Referring to FIGS. 13A and 13B, a liner insulating layer 25a and a conductive layer 24a may be formed to fill the first deep trench 9 and the second deep trench 10. For example, the liner insulating layer 25a may include a silicon oxide layer, and the conductive layer 24a may include poly-silicon doped with dopants having the first conductivity type (e.g., a P-type).

Figure 14A:
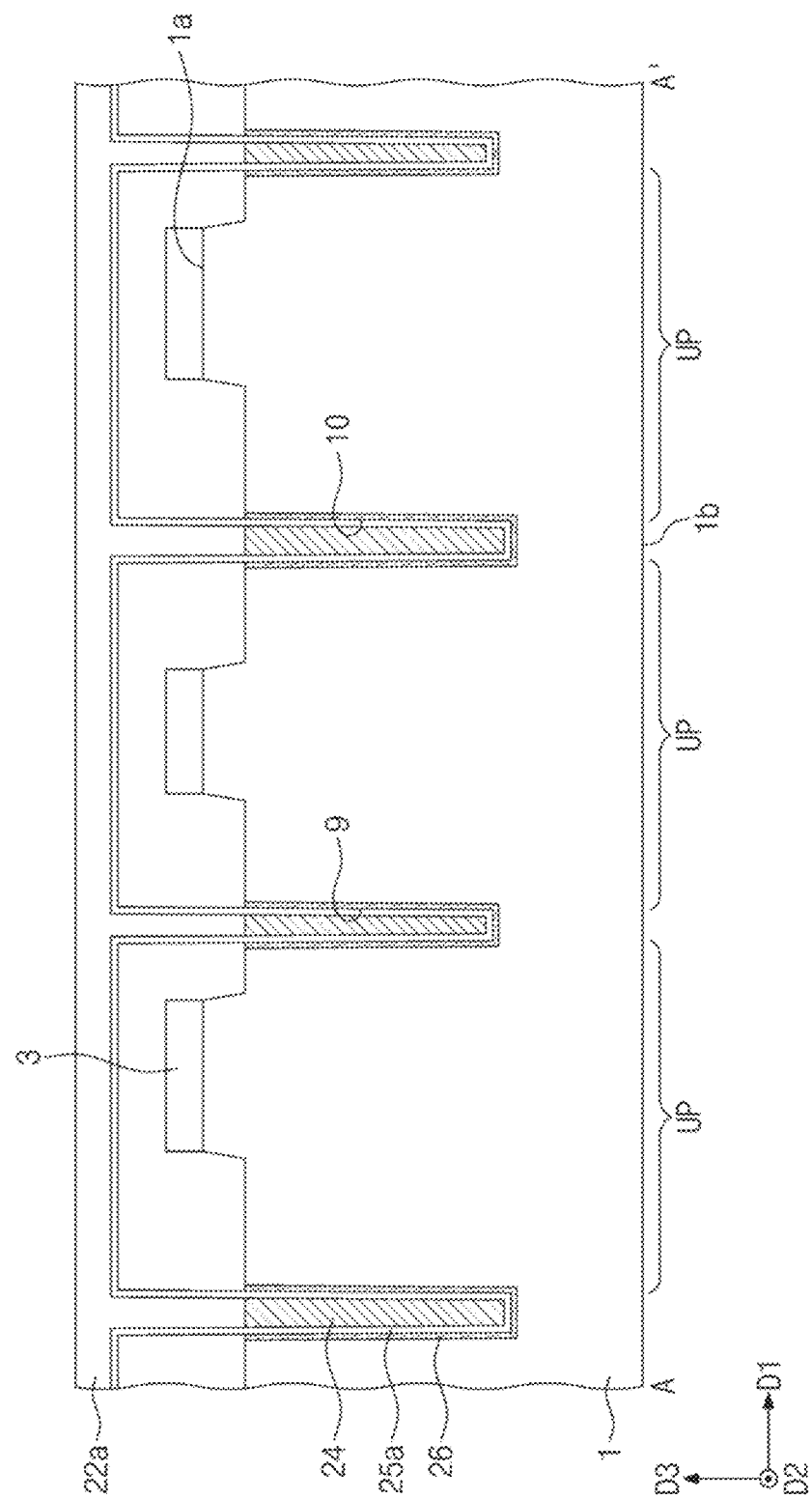
Figure 14B:
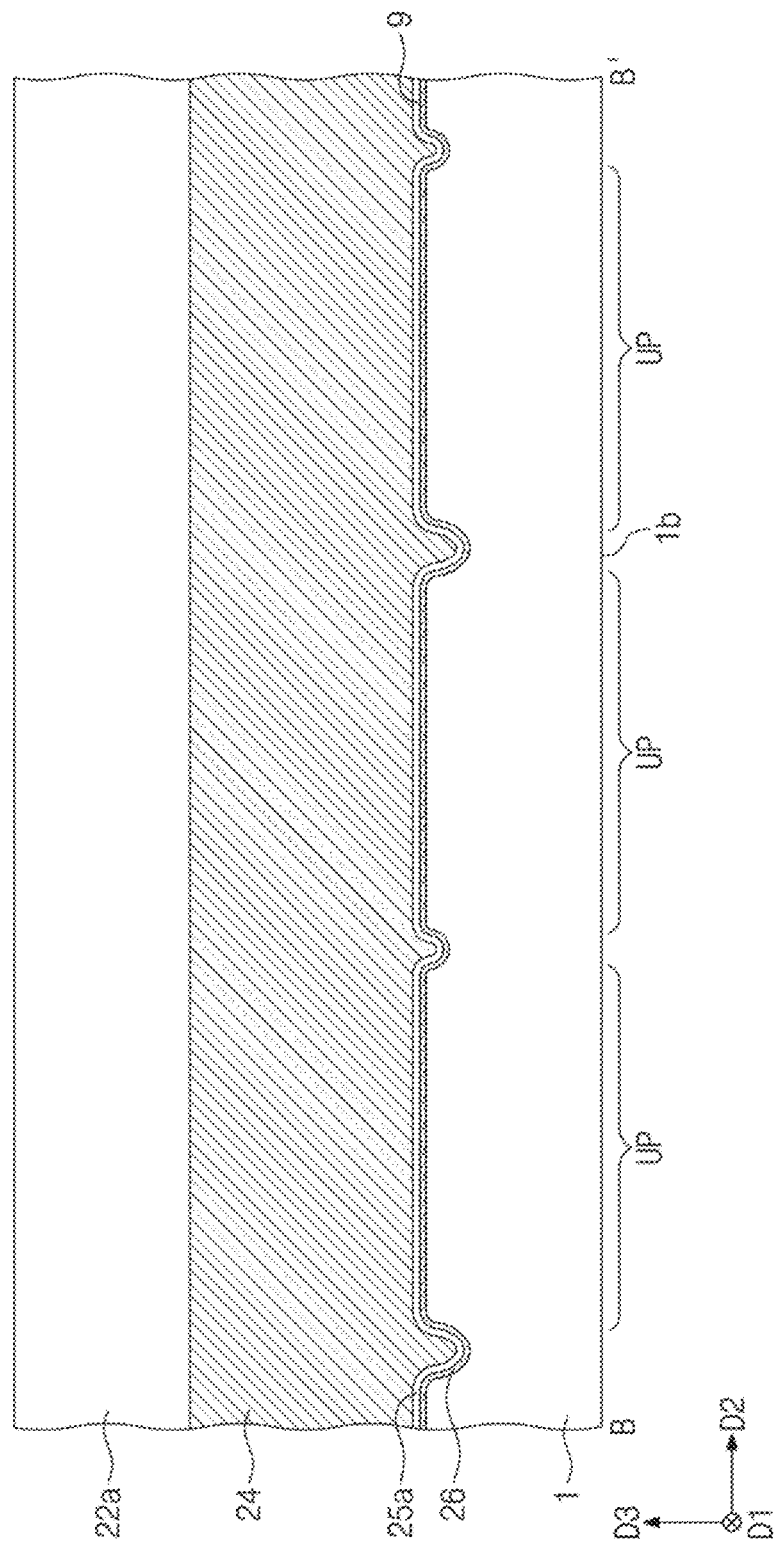

Referring to FIGS. 14A and 14B, a portion of the conductive layer 24a may be removed. A removal process of the conductive layer 24a may include an etch-back process. A conductive pattern 24 may be formed by the etch-back process. Thereafter, a second insulating layer 22a may be formed on the liner insulating layer 25a. The second insulating layer 22a may include a silicon oxide layer.

Figure 15A:
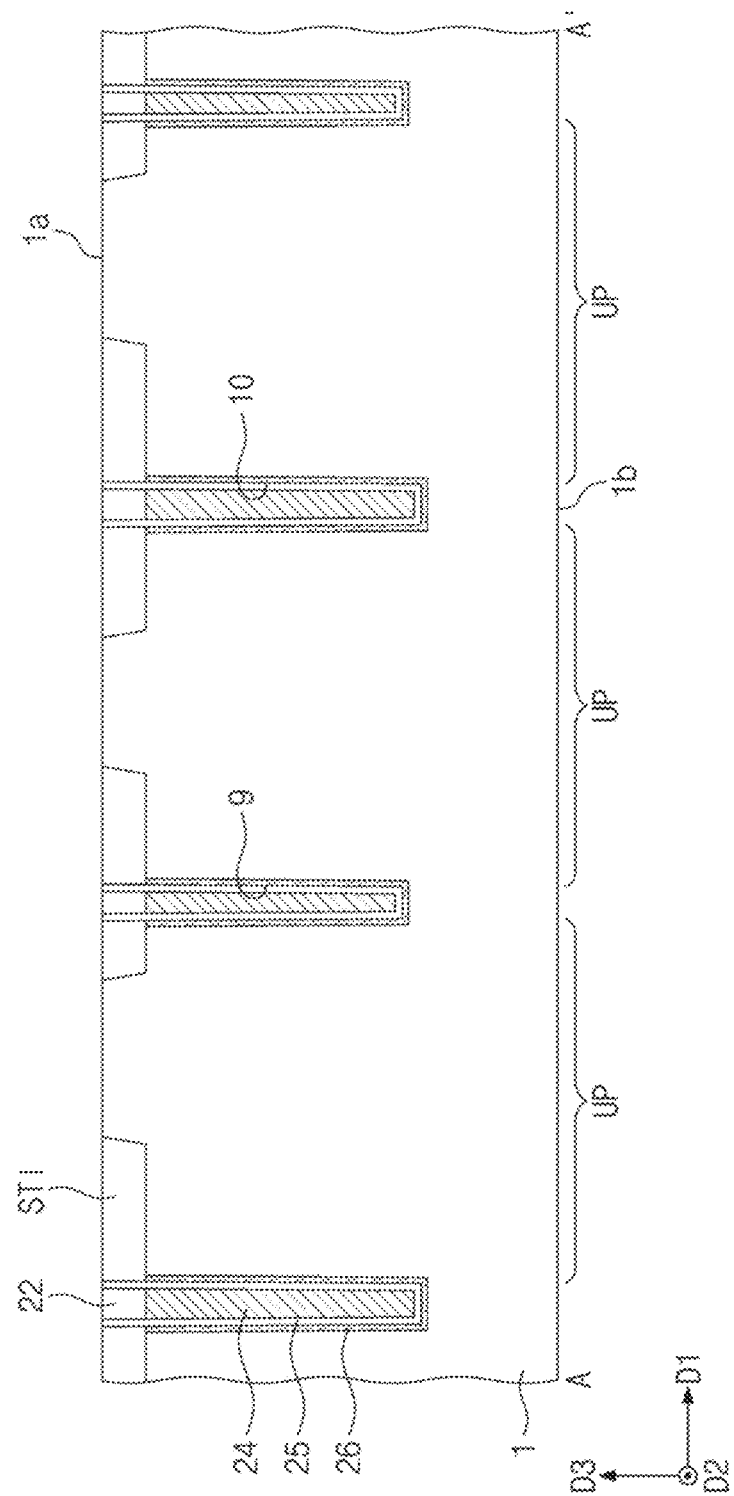
Figure 15B:
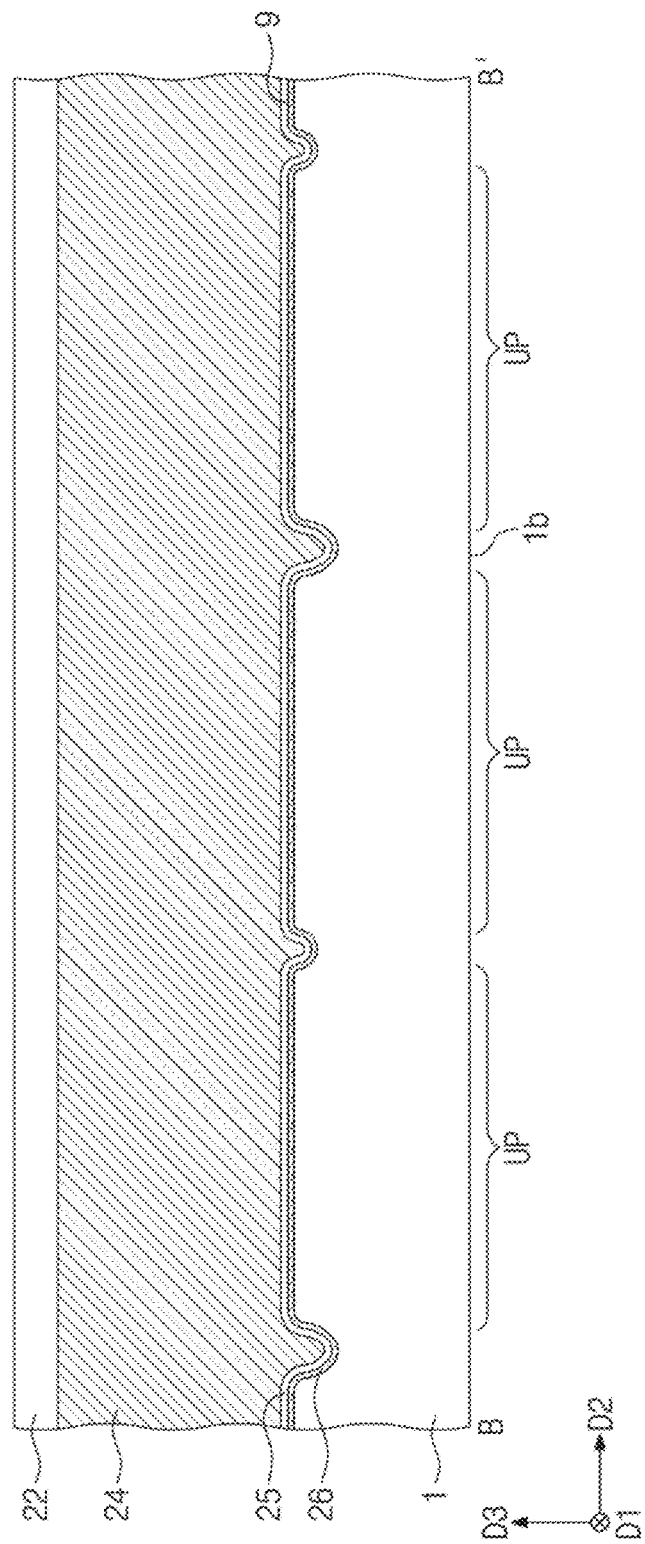

Referring to FIGS. 15A and 15B, a planarization process may be performed on the second surface 1b of the substrate 1. Portions of the first and second insulating layers 8 and 22a may be removed to form a shallow device isolation portion STI and a filling insulation pattern 22. In addition, a portion of the liner insulating layer 25a may be removed to form a liner insulating pattern 25. Active regions may be defined by the shallow device isolation portion STI.

Figure 16A:
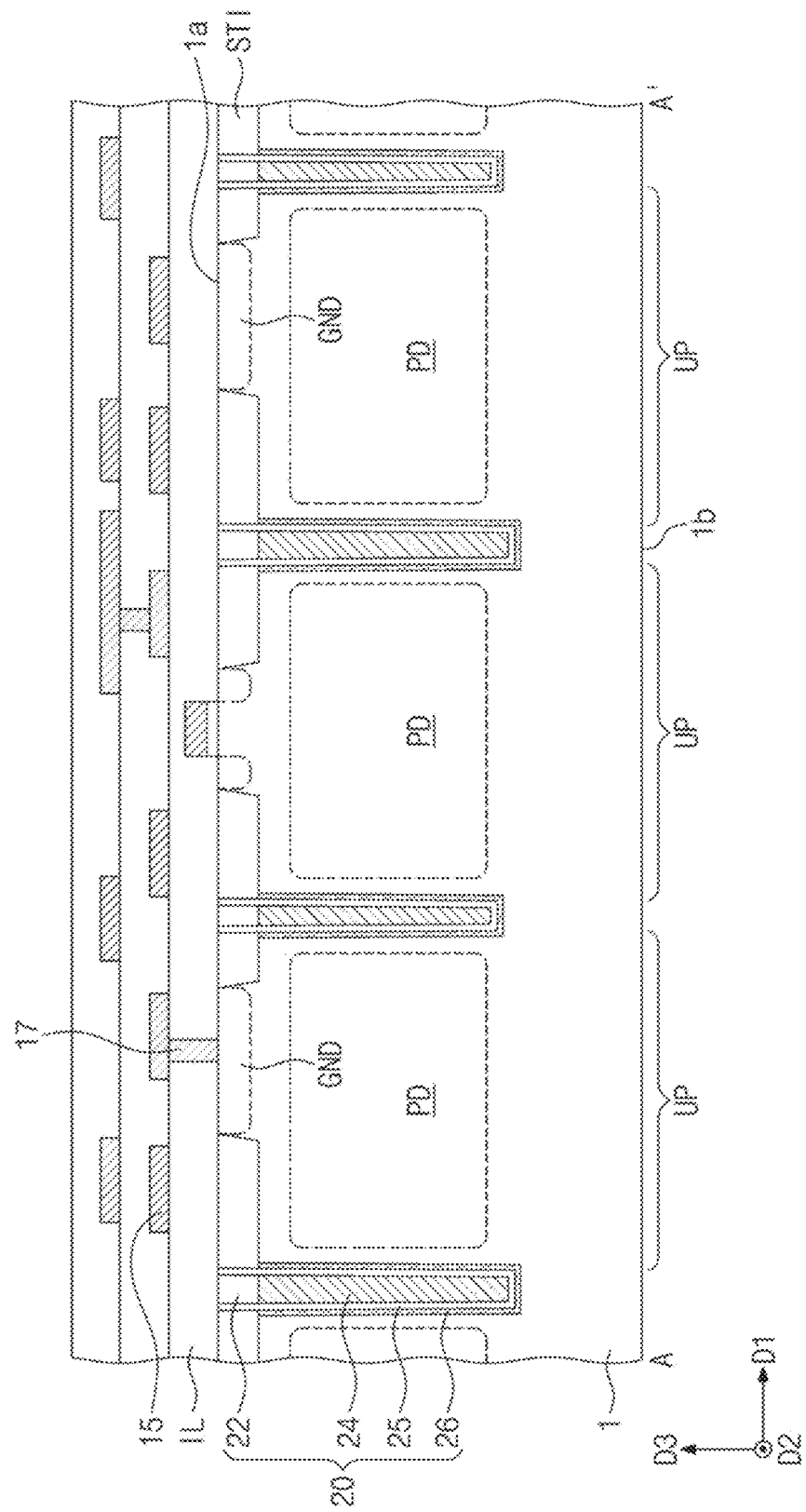
Figure 16B:
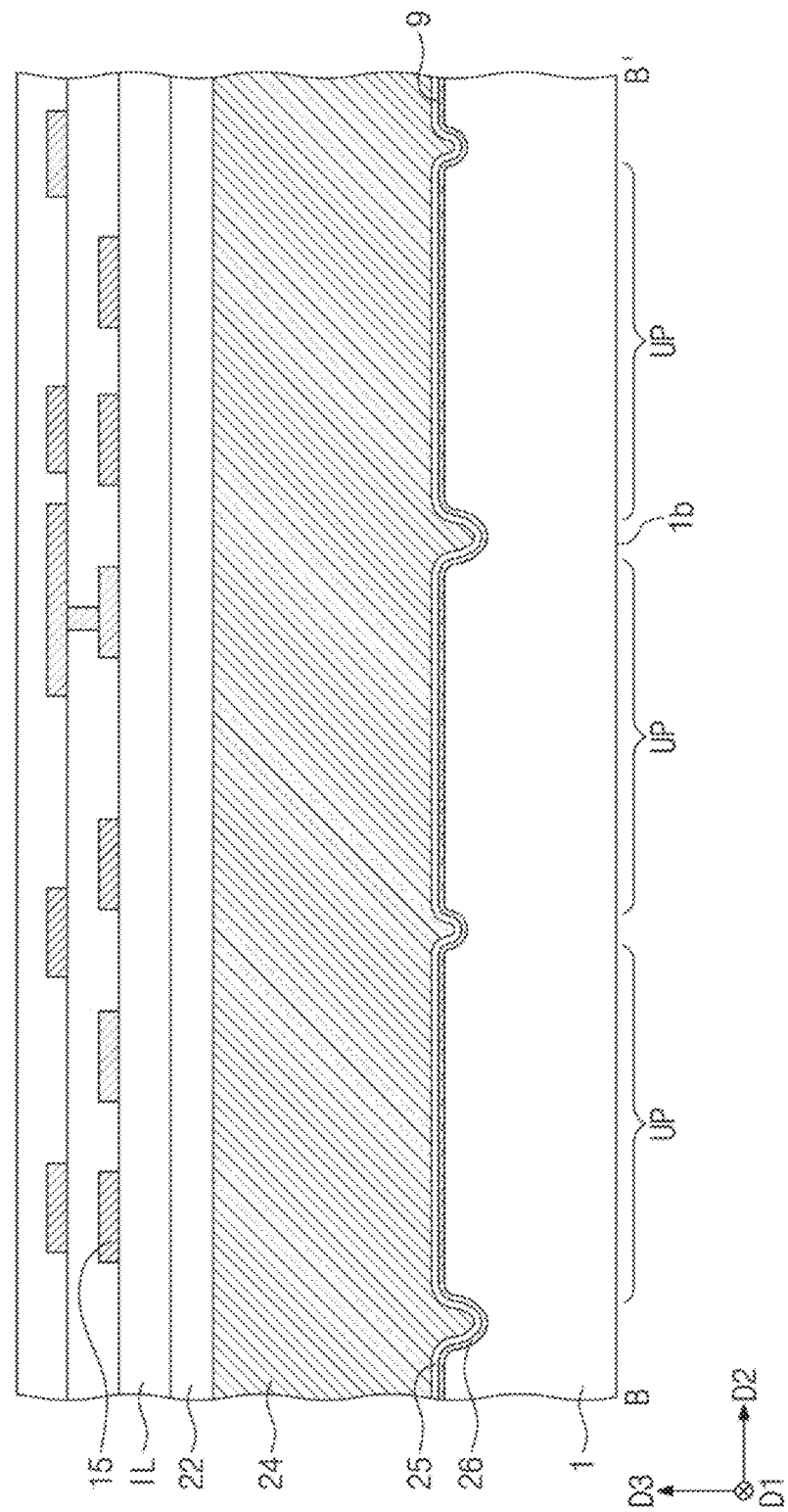

Referring to FIGS. 16A and 16B, an ion implantation process may be performed on the substrate 1 to form photoelectric conversion portions PD. Thus, unit pixels UP may be isolated from each other. In addition, general processes may be performed to form a gate insulating layer Gox, transfer gates TG, floating diffusion regions FD, contact plugs 17, interconnection lines 15, and interlayer insulating layers IL on the first surface 1a of the substrate 1.

Figure 17A:
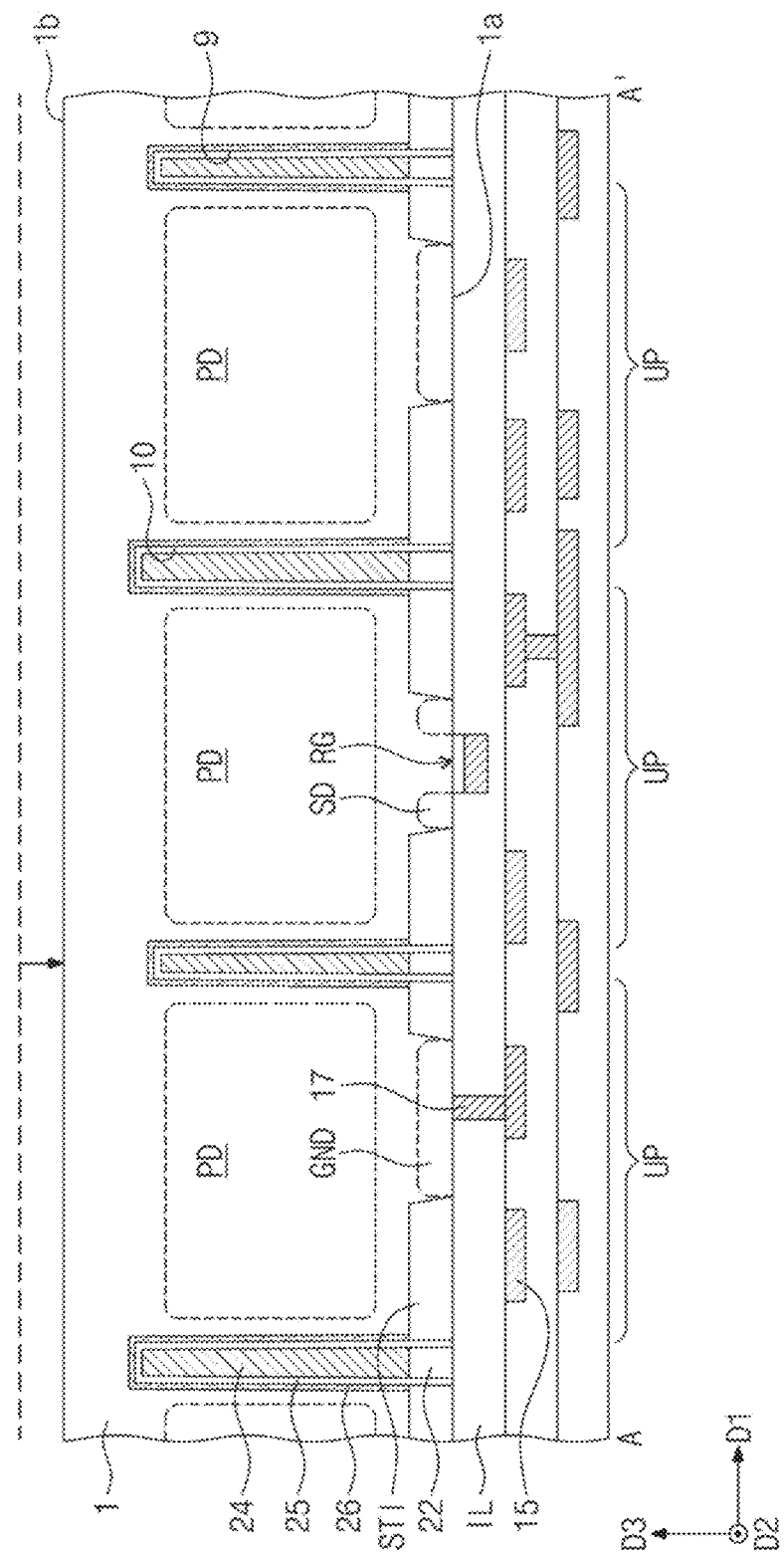
Figure 17B:
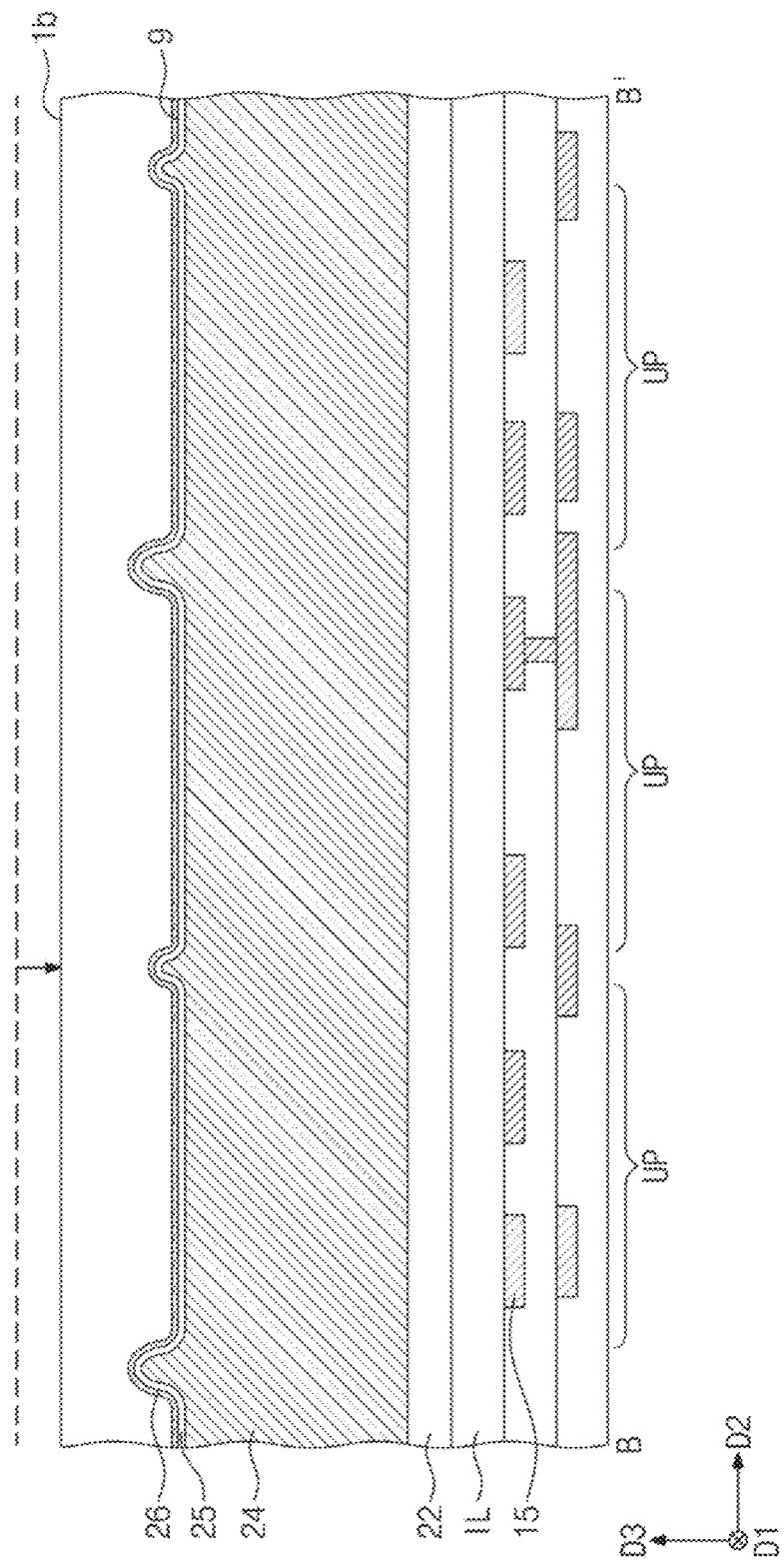

Referring to FIGS. 17A and 17B, the substrate 1 may be turned over in such a way that the second surface 1b faces upward. A grinding process or a chemical mechanical polishing (CMP) process may be performed to reduce a thickness of the substrate 1. The grinding process or the CMP process may be performed in such a way that the high-concentration doped pattern 26 is not exposed. In some example embodiments, this process may be omitted.

Figure 18A:
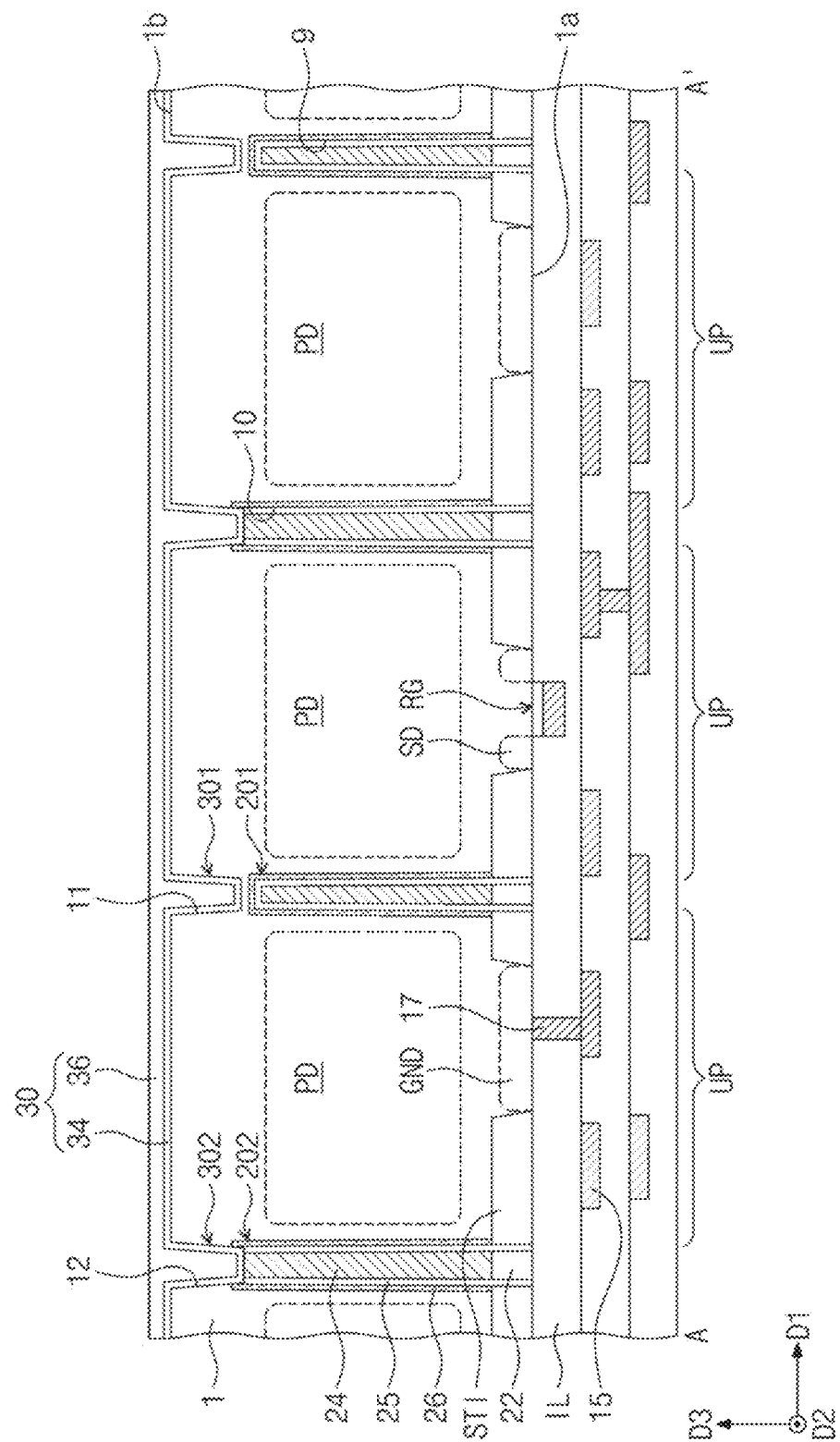
Figure 18B:
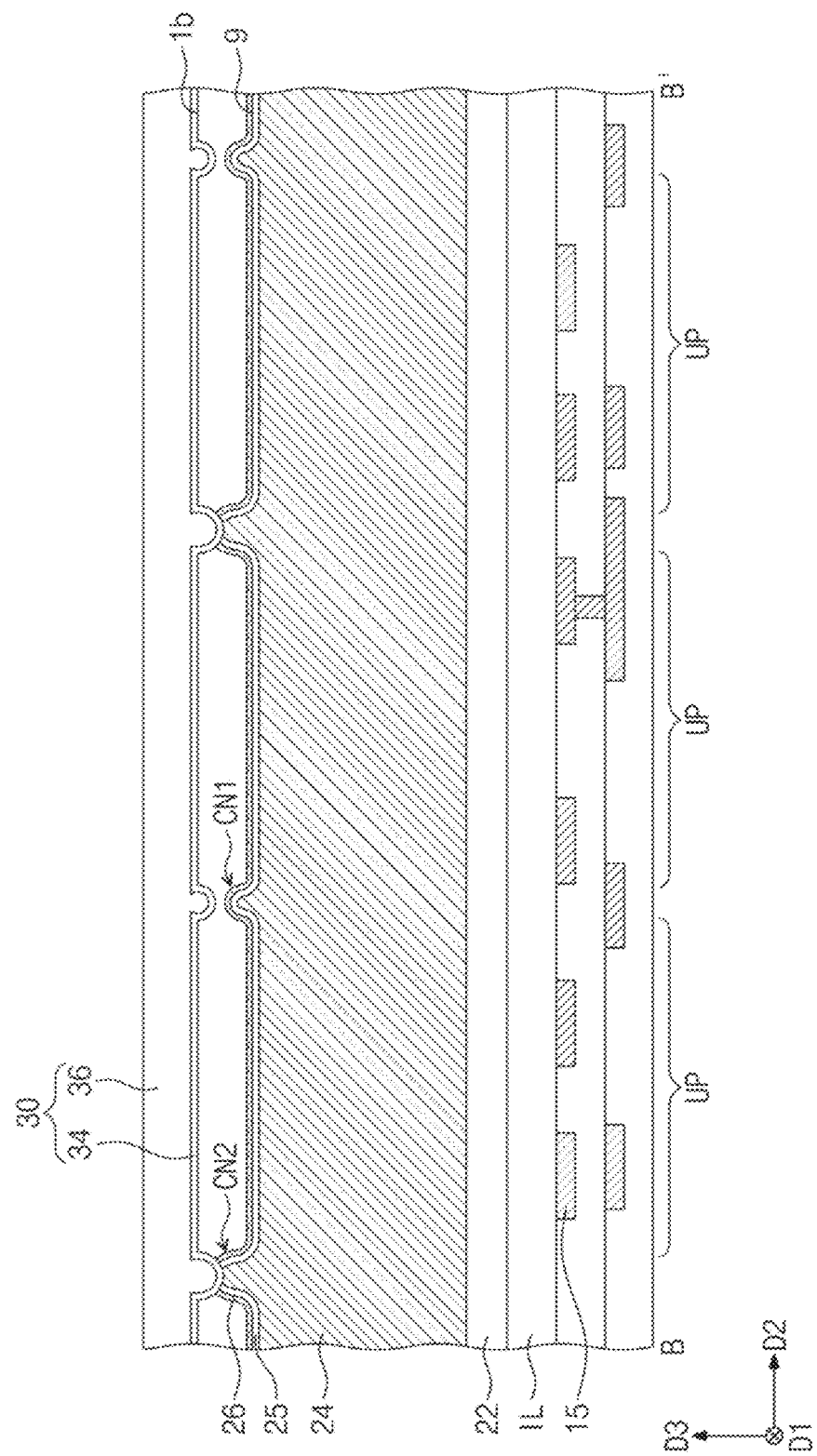

Referring to FIGS. 18A and 18B, a third etch mask pattern may be formed on the second surface 1b of the substrate 1. The third etch mask pattern may be formed to have openings overlapping with the first isolation pattern 201 and the second isolation pattern 202. The substrate 1 may be etched using the third etch mask pattern as an etch mask to form a third trench 11 and a fourth trench 12. The third trench 11 may be formed in such a way that a bottom surface of the third trench 11 is spaced apart from an uppermost portion of the first isolation pattern 201. The fourth trench 12 may be formed in such a way that a bottom surface of the fourth trench 12 exposes an uppermost portion of the second isolation pattern 202. A level of the bottom surface of the fourth trench 12 may be lower than a level of the bottom surface of the third trench 11. In some example embodiments, the bottom surface of the fourth trench 12 may not expose the uppermost portion of the second isolation pattern 202 (see FIG. 8A).

At this time, an etched amount of the substrate 1 between four neighboring pixels UP may be more than an etched amount of the substrate 1 between two neighboring pixels UP. In other words, the etched amount of the substrate 1 may be more in a place in which a pair of the third trenches 11 intersect each other and a place in which the fourth trench 12 intersects the third trench 11 or the fourth trench 12.

Next, the third etch mask pattern may be removed. Thereafter, a first fixed charge layer 34 may be conformally formed on the second surface 1b. The first fixed charge layer 34 may conformally cover an inner side surface and a bottom surface of the third trench 11 and an inner side surface and a bottom surface of the fourth trench 12. An insulating pattern 36 may be formed on the first fixed charge layer 34 to fill the third trench 11 and the fourth trench 12.

Figure 19A:
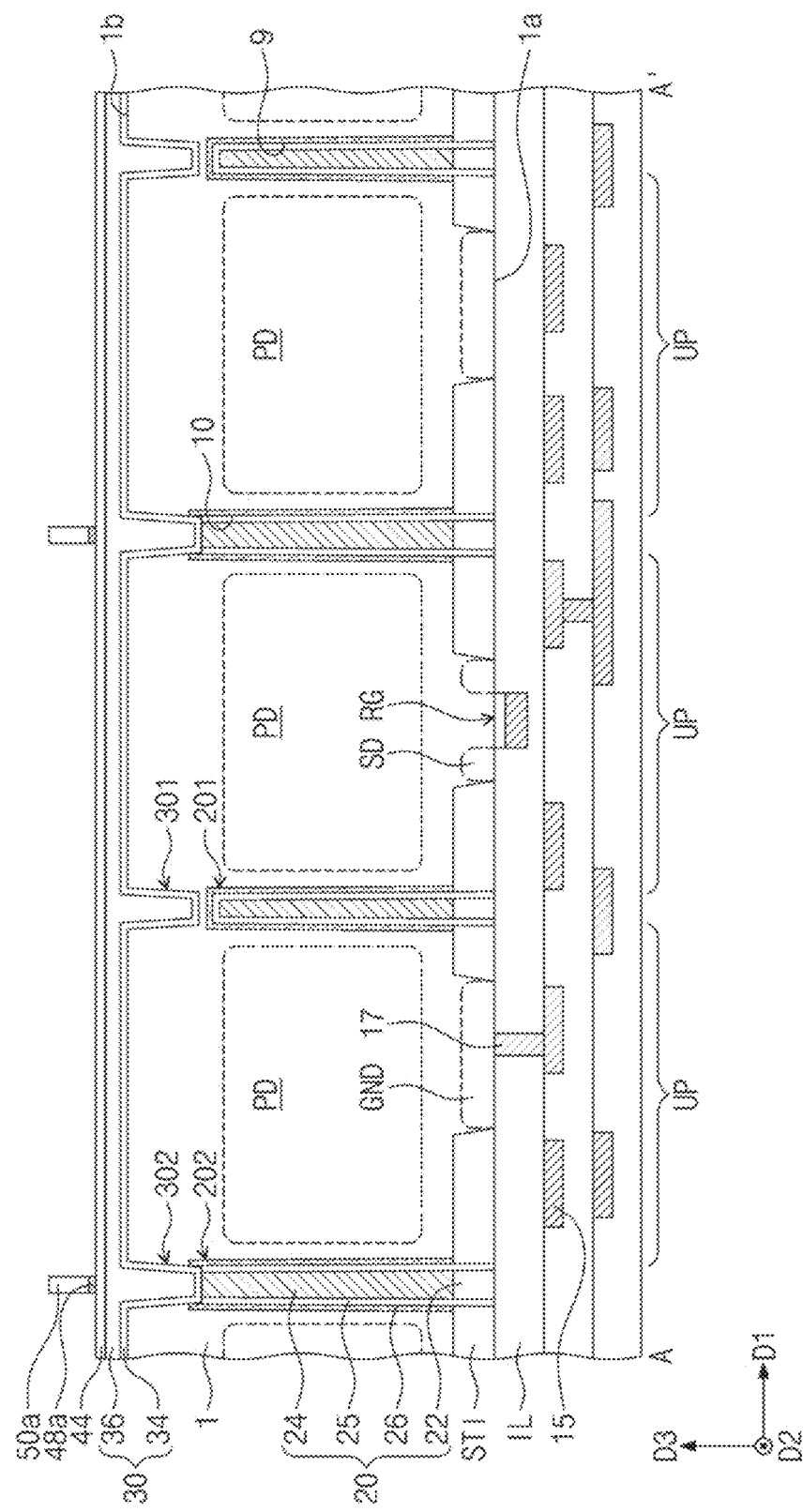
Figure 19B:
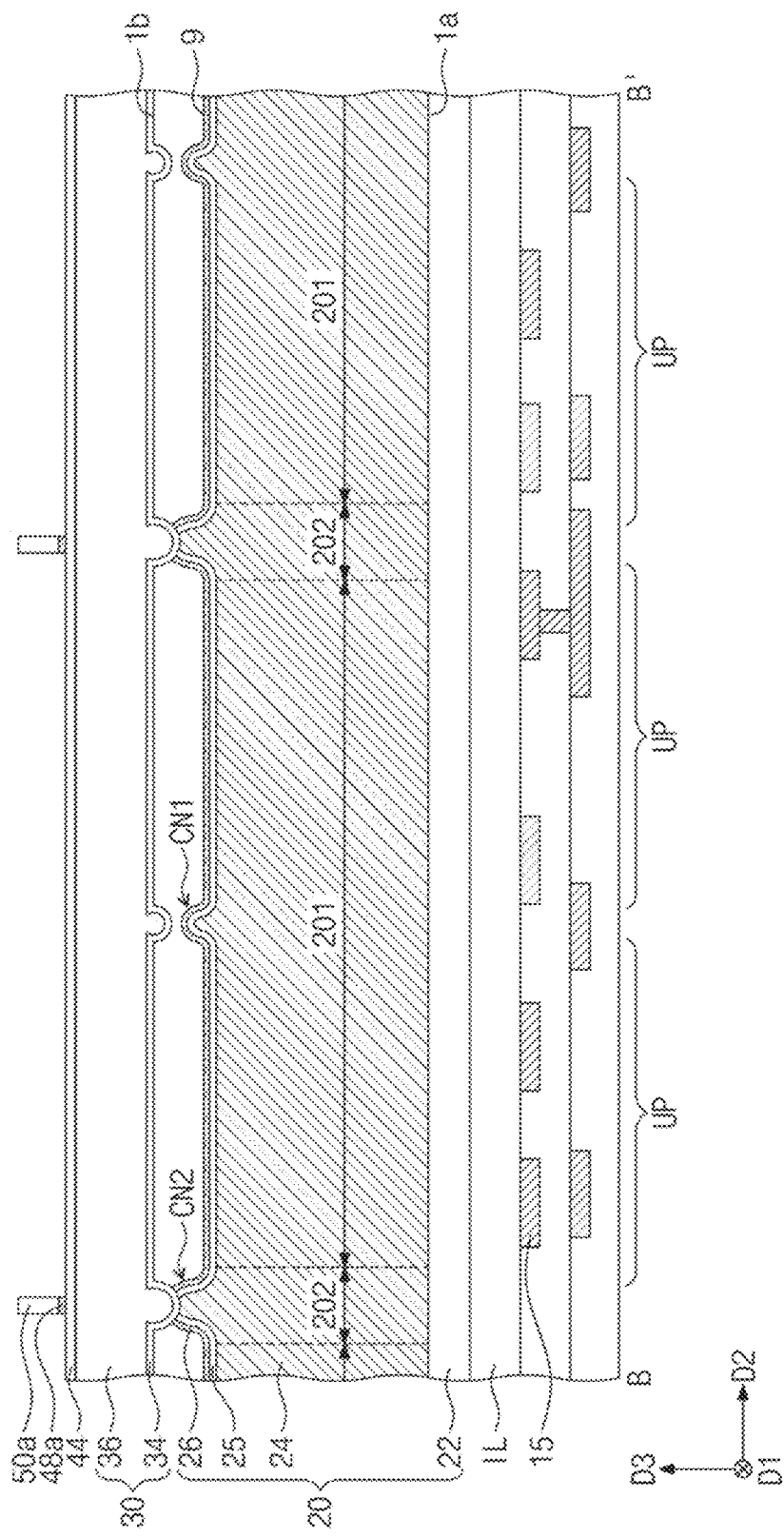

Referring to FIGS. 19A and 19B, a second fixed charge layer (not shown) and a first protective layer 44 may be sequentially formed. A diffusion barrier layer and a first metal layer may be sequentially formed on the first protective layer 44. The first metal layer may be etched to form a low-refractive index pattern 50a. The diffusion barrier layer may be etched to form a light blocking pattern 48a.

Referring again to FIGS. 5A and 5B, a second protective layer 56 may be conformally formed on the first protective layer 44. Color filters CF1, CF2 and CF3 may be formed in openings of the low-refractive index pattern 50a on the second protective layer 56. A micro lens array layer ML may be formed on the color filters CF1, CF2 and CF3. Thus, the image sensor 500 of FIGS. 5A and 5B may be manufactured.

Figure 20:
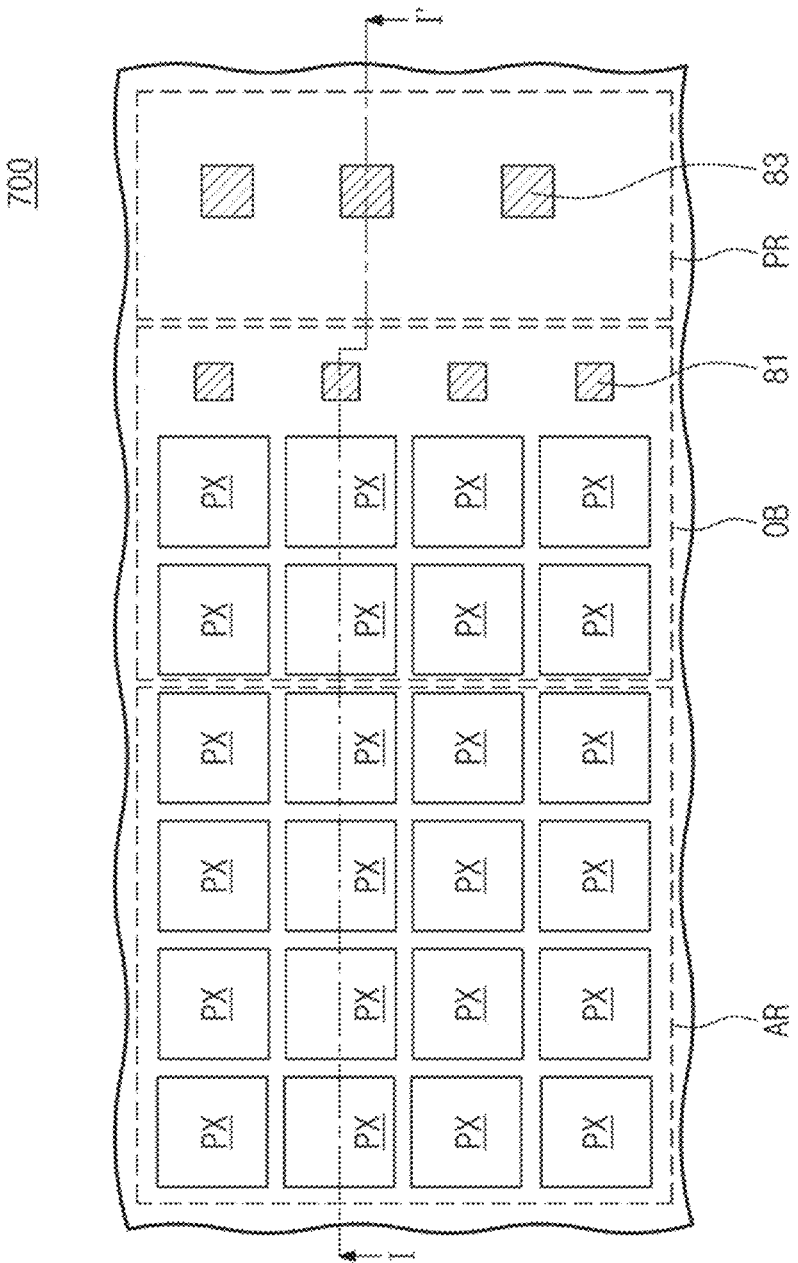
FIG. 20 is a plan view illustrating an image sensor according to some example embodiments of the inventive concepts.
Figure 21:
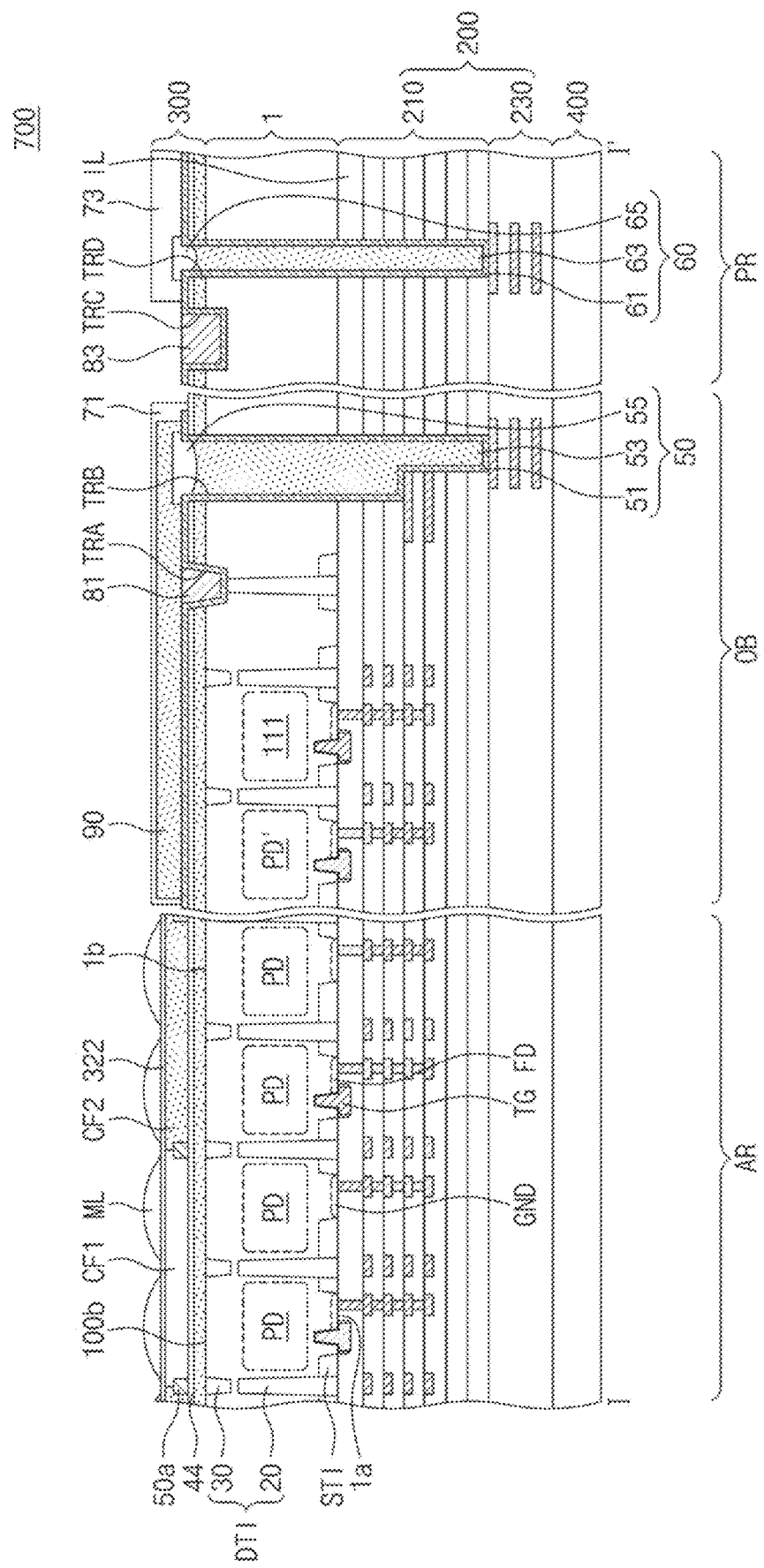
FIG. 21 is a cross-sectional view taken along a line I-I' of FIG. 20.

FIG. 20 is a plan view illustrating an image sensor according to some example embodiments of the inventive concepts, and FIG. 21 is a cross-sectional view taken along a line I-I' of FIG. 20.

Referring to FIGS. 20 and 21, an image sensor 700 may include a substrate 1 including a pixel array region AR, an optical black region OB and a pad region PR, an interconnection layer 200 on a first surface 1a of the substrate 1, a base substrate 400 on the interconnection layer 200, and a light transmitting layer 300 on a second surface 1b of the substrate 1. The interconnection layer 200 may be disposed between the first surface 1a of the substrate 1 and the base substrate 400. The interconnection layer 200 may include an upper interconnection layer 210 adjacent to the first surface 1a of the substrate 1, and a lower interconnection layer 230 between the upper interconnection layer 210 and the base substrate 400. The pixel array region AR may include a plurality of pixels PX, and a deep device isolation portion DTI disposed therebetween. The deep device isolation portion DTI may be substantially the same as the deep device isolation portion DTI of the image sensor 500 or 600 described above.

A first connection structure 50, a first contact 81, and a bulk color filter 90 may be disposed on the optical black region OB of the substrate 1. The first connection structure 50 may include a first light blocking pattern 51, a first low-refractive index residual layer 53, and a first capping pattern 55. The first light blocking pattern 51 may be disposed on the second surface 1b of the substrate 1. The first light blocking pattern 51 may cover the first protective layer 44 and may conformally cover an inner surface of each of a first trench TRA and a second trench TRB. The first light blocking pattern 51 may penetrate the substrate 1 and the upper interconnection layer 210. The first light blocking pattern 51 may be connected to the first isolation portion 20 of the deep device isolation portion DTI of the substrate 1 and may be connected to interconnection lines in the upper interconnection layer 210 and the lower interconnection layer 230. Thus, the first connection structure 50 may electrically connect the substrate 1 and the interconnection layer 200. The first light blocking pattern 51 may include a metal material (e.g., tungsten). The first light blocking pattern 51 may block light incident toward the optical black region OB.

The first contact 81 may fill a remaining portion of the first trench TRA. The first contact 81 may include a metal material (e.g., aluminum). The first contact 81 may be connected to the first isolation portion 20 of the deep device isolation portion DTI. A bias may be applied to the first isolation portion 20 through the first contact 81. The first low-refractive index residual layer 53 may fill a remaining portion of the second trench TRB. The first low-refractive index residual layer 53 may penetrate the substrate 1 and may penetrate a portion of the interconnection layer 200. The first low-refractive index residual layer 53 may include an insulating material. The first capping pattern 55 may be disposed on the first low-refractive index residual layer 53. The first capping pattern 55 may include the same material as the filling insulation pattern 22 of the deep device isolation portion DTI.

The bulk color filter 90 may be disposed on the first connection structure 50 and the first contact 81. The bulk color filter 90 may cover the first connection structure 50 and the first contact 81. A third protective layer 71 may be disposed on the bulk color filter 90 to seal or encapsulate the bulk color filter 90.

An additional photoelectric conversion portion PD' and a dummy region 111 may be provided in corresponding pixels PX of the optical black region OB. The additional photoelectric conversion portion PD' may be a region doped with dopants having a second conductivity type (e.g., an N-type) different from the first conductivity type of the substrate 1. The additional photoelectric conversion portion PD' may have a structure similar to that of the photoelectric conversion portions PD in the plurality of pixels PX of the pixel array region AR but may not perform the same operation (e.g., the operation of converting received light into an electrical signal) as the photoelectric conversion portions PD. The dummy region 111 may not be doped with dopants.

A second connection structure 60, a second contact 83 and a fourth protective layer 73 may be disposed on the pad region PR of the substrate 1. The second connection structure 60 may include a second light blocking pattern 61, a second low-refractive index residual layer 63, and a second capping pattern 65.

The second light blocking pattern 61 may be disposed on the second surface 1b of the substrate 1. The second light blocking pattern 61 may cover the first protective layer 44 and may conformally cover an inner surface of each of a third trench TRC and a fourth trench TRD. The second light blocking pattern 61 may penetrate the substrate 1 and the upper interconnection layer 210. The second light blocking pattern 61 may be connected to interconnection lines in the lower interconnection layer 230. Thus, the second connection structure 60 may electrically connect the substrate 1 and the interconnection layer 200. The second light blocking pattern 61 may include a metal material (e.g., tungsten). The second light blocking pattern 61 may block light incident toward the pad region PR.

The second contact 83 may fill a remaining portion of the third trench TRC. The second contact 83 may include a metal material (e.g., aluminum). The second contact 83 may function as an electrical connection path between the image sensor 700 and an external device. The second low-refractive index residual layer 63 may fill a remaining portion of the fourth trench TRD. The second low-refractive index residual layer 63 may penetrate the substrate 1 and may penetrate a portion of the interconnection layer 200. The second low-refractive index residual layer 63 may include an insulating material. The second capping pattern 65 may be disposed on the second low-refractive index residual layer 63. The second capping pattern 65 may include the same material as the filling insulation pattern 22 of the deep device isolation portion DTI. The fourth protective layer 73 may cover the second connection structure 60.

A current applied through the second contact 83 may flow into the first isolation portion 20 of the deep device isolation portion DTI through the second light blocking pattern 61 the interconnection lines in the interconnection layer 200, and the first light blocking pattern 51. Electrical signals generated from the photoelectric conversion portions PD in the plurality of pixels PX of the pixel array region AR may be transmitted to the outside through the interconnection lines in the interconnection layer 200, the second light blocking pattern 61, and the second contact 83.

According to some example embodiments of the inventive concepts, the pixels included in each of the pixel groups may share the ground region. When four pixels constitute a single pixel group, the ground region may be selectively provided in one of the four pixels. The deep device isolation portion isolating the pixels may include first and second isolation patterns vertically overlapping with each other and spaced apart from each other. Positive charges of the pixels not having the ground region may be moved to the ground region through the high-concentration doped pattern of the first isolation pattern. As a result, positive charges of three pixels not having the ground region may be discharged to the ground region through the first isolation pattern. In addition, since the three pixels do not require the ground region, areas of the gate electrodes of the image sensor may be increased.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor comprising:
a substrate having a first surface and a second surface opposite to the first surface;
a first pixel group comprising first-four photoelectric conversion portions (PDs) arranged in a 2×2 matrix;
a second pixel group comprising second-four PDs arranged in the 2×2 matrix;
a first color filter on the first pixel group;
a second color filter on the second pixel group;
a first ground region on the first surface and shared by the first pixel group;
a second ground region on the first surface and shared by the second pixel group;
a first isolation pattern extending from the second surface toward the first surface and being disposed between the first-four PDs;
a second isolation pattern extending from the first surface toward the second surface and being disposed between the first-four PDs;
a third isolation pattern extending from the second surface toward the first surface and being disposed between the first pixel group and the second pixel group;
a fourth isolation pattern extending from the first surface toward the second surface and being disposed between the first pixel group and the second pixel group; and
a micro lens array stacked on the second surface,
wherein the first isolation pattern is vertically overlapped with the second isolation pattern and spaced apart from the second isolation pattern in a first direction perpendicular to the first surface,
wherein the first color filter is different from the second color filter,
wherein the first pixel group is directly adjacent to the second pixel group in a second direction,
wherein the second isolation pattern includes a filling insulating pattern extending in the first direction from a level of the first surface of the substrate, and
wherein the third isolation pattern is in contact with the fourth isolation pattern.

2. The image sensor of claim 1, wherein the first isolation pattern has a first length in the first direction and the second isolation pattern has a second length greater than the first length.

3. The image sensor of claim 2, further comprising a light blocking pattern between the first pixel group and the second pixel group, and
wherein each of the first and second pixel groups does not comprise any light blocking pattern.

4. The image sensor of claim 2, wherein the first ground region is selectively disposed under one of the first-four PDs, and
wherein the second ground region is selectively disposed under one of the second-four PDs.

5. The image sensor of claim 2, further comprising a contact plug connected to the first ground region, and
wherein the contact plug is vertically overlapped with the first ground region in the first direction.

6. The image sensor of claim 5, further comprising a shallow device isolation portion between the first ground region and the second isolation pattern.

7. The image sensor of claim 2, wherein the fourth isolation pattern has a third length in the first direction different from the second length.

8. The image sensor of claim 7, wherein the third length is greater than the second length.

9. An image sensor comprising:
a substrate having a first surface and a second surface opposite to the first surface;
a first pixel group and a second pixel group, wherein each of the first and second pixel groups includes $N^2$ pixels arranged in a N×N matrix form along a first direction and a second direction perpendicular to the first direction in a plan view, where 'N' is a natural number of 2 or more;
a first color filter on the first pixel group;
a second color filter on the second pixel group;
a first ground region on the first surface and shared by the $N^2$ pixels in the first pixel group;

a second ground region on the first surface and shared by the $N^2$ pixels in the second pixel group;

a first isolation pattern extending from the second surface toward the first surface and being disposed between the $N^2$ pixels in the first pixel group;

a second isolation pattern extending from the first surface toward the second surface and being disposed between the $N^2$ pixels in the first pixel group;

a third isolation pattern extending from the second surface toward the first surface and being disposed between the first pixel group and the second pixel group;

a fourth isolation pattern extending from the first surface toward the second surface and being disposed between the first pixel group and the second pixel group; and a micro lens array stacked on the second surface, wherein the first isolation pattern is vertically overlapped with the second isolation pattern and spaced apart from the second isolation pattern in a third direction perpendicular to the first surface, wherein the first color filter is different from the second color filter, wherein the first pixel group is directly adjacent to the second pixel group in the first direction in the plan view, wherein the second isolation pattern includes a filling insulating pattern extending in the third direction from a level of the first surface of the substrate, and wherein the third isolation pattern and the fourth isolation pattern are in contact with each other.

10. The image sensor of claim 9, wherein the first isolation pattern has a first length in the third direction and the second isolation pattern has a second length in the third direction, and wherein the second length is greater than the first length.

11. The image sensor of claim 10, wherein the first ground region is selectively disposed in one of the $N^2$ pixels in the first pixel group.

12. The image sensor of claim 10, wherein each of the first and second pixel groups includes $N^2$ micro lenses.

13. The image sensor of claim 10, wherein the first pixel group comprises a transfer gate, and wherein a portion of the transfer gate extends into the substrate from the first surface.

14. The image sensor of claim 13, further comprising a contact plug connected to the first ground region, and wherein the contact plug is vertically overlapped with the first ground region in the third direction.

15. The image sensor of claim 13, further comprising a shallow device isolation portion between the first ground region and the second isolation pattern, and wherein the shallow device isolation portion is in contact with the second isolation pattern.

16. The image sensor of claim 10, wherein the fourth isolation pattern has a third length in the third direction different from the second length.

17. The image sensor of claim 16, wherein the third length is greater than the second length.

18. An image sensor comprising:

a substrate having a first surface and a second surface opposite to the first surface;

a first pixel group comprising first-four photoelectric conversion portions (PDs) arranged in a 2×2 matrix;

a second pixel group comprising second-four PDs arranged in the 2×2 matrix;

a first color filter on the first pixel group;

a second color filter on the second pixel group;

a first ground region on the first surface and shared by the first-four PDs;

a second ground region on the first surface and shared by the second-four PDs;

a first isolation pattern extending from the second surface toward the first surface and being disposed between the first-four PDs;

a second isolation pattern extending from the first surface toward the second surface and being disposed between the first-four PDs;

a third isolation pattern extending from the second surface toward the first surface and being disposed between the first pixel group and the second pixel group;

a fourth isolation pattern extending from the first surface toward the second surface and being disposed between the first pixel group and the second pixel group; and a micro lens array stacked on the second surface, wherein the first isolation pattern is vertically overlapped with the second isolation pattern and spaced apart from the second isolation pattern in a first direction perpendicular to the first surface, wherein the third isolation pattern is in contact with the fourth isolation pattern in the first direction, wherein the first color filter is different from the second color filter, and wherein the first pixel group is directly adjacent to the second pixel group in a second direction.

\* \* \* \* \*